(12) United States Patent
Mawatari

(10) Patent No.: US 11,355,357 B2
(45) Date of Patent: Jun. 7, 2022

(54) SEMICONDUCTOR DEVICE AND METHOD FOR PRODUCING THE SEMICONDUCTOR DEVICE

(71) Applicant: DENSO CORPORATION, Kariya (JP)

(72) Inventor: Kazuaki Mawatari, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/747,047

(22) Filed: Jan. 20, 2020

(65) Prior Publication Data

US 2020/0152482 A1 May 14, 2020

Related U.S. Application Data

(63) Continuation of application No. PCT/JP2018/025293, filed on Jul. 4, 2018.

(30) Foreign Application Priority Data

Jul. 24, 2017 (JP) .............................. JP2017-142852
Jun. 13, 2018 (JP) .............................. JP2018-113061

(51) Int. Cl.
*H01L 21/56* (2006.01)
*H01L 23/00* (2006.01)
(Continued)

(52) U.S. Cl.
CPC .............. *H01L 21/56* (2013.01); *H01L 23/12* (2013.01); *H01L 23/29* (2013.01); *H01L 23/31* (2013.01); *H01L 23/4334* (2013.01); *H01L 24/16* (2013.01); *H01L 24/48* (2013.01); *H01L 24/73* (2013.01); *H01L 25/043* (2013.01);
(Continued)

(58) Field of Classification Search
CPC ......... H01L 21/56; H01L 23/12; H01L 23/29; H01L 23/31; H01L 23/4334; H01L 24/16; H01L 24/48; H01L 24/73; H01L 25/043; H01L 25/18; H01L 2224/16145;
(Continued)

(56) References Cited

U.S. PATENT DOCUMENTS 7,202,107 B2 4/2007 Fuergut et al.
2001/0000927 A1* 5/2001 Rodenbeck ........... H01L 21/563
257/778

(Continued)

FOREIGN PATENT DOCUMENTS

JP H10-012773 A 1/1998
JP 2014-017367 A 1/2014
(Continued)

*Primary Examiner* — Timor Karimy
(74) *Attorney, Agent, or Firm* — Posz Law Group, PLC

(57) ABSTRACT

A semiconductor device includes a semiconductor element, an electronic component electrically connected to the semiconductor element, a connection member electrically connecting the electronic component to the semiconductor element, and a sealing resin portion having a first surface and a second surface opposite to the first surface and integrally holding the semiconductor element, the electronic component, and the connection member in a state where a semiconductor top surface as a surface of the semiconductor (Continued)

element and a component surface as a surface of the electronic component are exposed from the sealing resin portion on a side adjacent to the first surface.

9 Claims, 14 Drawing Sheets

(51) Int. Cl.
H01L 23/12 (2006.01)
H01L 23/29 (2006.01)
H01L 23/31 (2006.01)
H01L 23/433 (2006.01)
H01L 25/04 (2014.01)
H01L 25/18 (2006.01)

(52) U.S. Cl.
CPC .... *H01L 25/18* (2013.01); *H01L 2224/16145* (2013.01); *H01L 2224/48137* (2013.01); *H01L 2224/73265* (2013.01); *H01L 2924/181* (2013.01); *H01L 2924/19105* (2013.01)

(58) Field of Classification Search
CPC . H01L 2224/48137; H01L 2224/73265; H01L 2924/181; H01L 2924/19105
See application file for complete search history.

(56) References Cited

U.S. PATENT DOCUMENTS

| 2009/0152714 | A1 | 6/2009 | Yamagishi et al. |
| 2010/0035373 | A1 | 2/2010 | Hunziker et al. |
| 2010/0117185 | A1 | 5/2010 | Hunziker et al. |
| 2012/0075816 | A1* | 3/2012 | Mashimo ............ H01L 23/3121 361/760 |
| 2012/0223444 | A1 | 9/2012 | Yamagishi et al. |
| 2014/0217620 | A1 | 8/2014 | Yamagishi et al. |
| 2018/0218968 | A1* | 8/2018 | Sato ................. H01L 23/49575 |

FOREIGN PATENT DOCUMENTS

| JP | 5548077 | B2 | | 7/2014 |
| JP | 5552404 | B2 | | 7/2014 |
| JP | 2014-187135 | A | | 10/2014 |
| JP | 2015-108517 | | * | 6/2015 |
| JP | 2015-108517 | A | | 6/2015 |
| JP | 2016-189360 | A | | 11/2016 |
| JP | 2017-016223 | | * | 1/2017 |
| WO | 2016/047130 | A1 | | 4/2017 |

* cited by examiner

SEMICONDUCTOR DEVICE AND METHOD FOR PRODUCING THE SEMICONDUCTOR DEVICE

CROSS REFERENCE TO RELATED APPLICATIONS

The present application is a continuation application of International Patent Application No. PCT/JP2018/025293 filed on Jul. 4, 2018, which designated the U.S. and claims the benefit of priority from Japanese Patent Applications No. 2017-142852 filed on Jul. 24, 2017 and No. 2018-113061 filed on Jun. 13, 2018. The entire disclosures of all of the above applications are incorporated herein by reference.

TECHNICAL FIELD

The present disclosure relates to a semiconductor device and a method for producing the semiconductor device.

BACKGROUND

As an example of a semiconductor device, there has been a semiconductor package in which a sensor chip is bonded to a lead frame, and the sensor chip and the lead frame are covered with a resin in a state where a portion of the sensor chip and a portion of the lead frame are exposed.

SUMMARY

The present disclosure describes a semiconductor device and a method for producing the semiconductor device. The semiconductor device may include a semiconductor element, an electronic component electrically connected to the semiconductor element, a connection member electrically connecting the electronic component to the semiconductor element, and a sealing resin portion having a first surface and a second surface opposite to the first surface and integrally holding the semiconductor element, the electronic component, and the connection member in a state where a semiconductor top surface as a surface of the semiconductor element and a component surface as a surface of the electronic component are exposed from the sealing resin portion on a side adjacent to the first surface.

BRIEF DESCRIPTION OF DRAWINGS

Features and advantages of the present disclosure will become more apparent from the following detailed description made with reference to the accompanying drawings. In the drawings.

DETAILED DESCRIPTION

Figure 1:
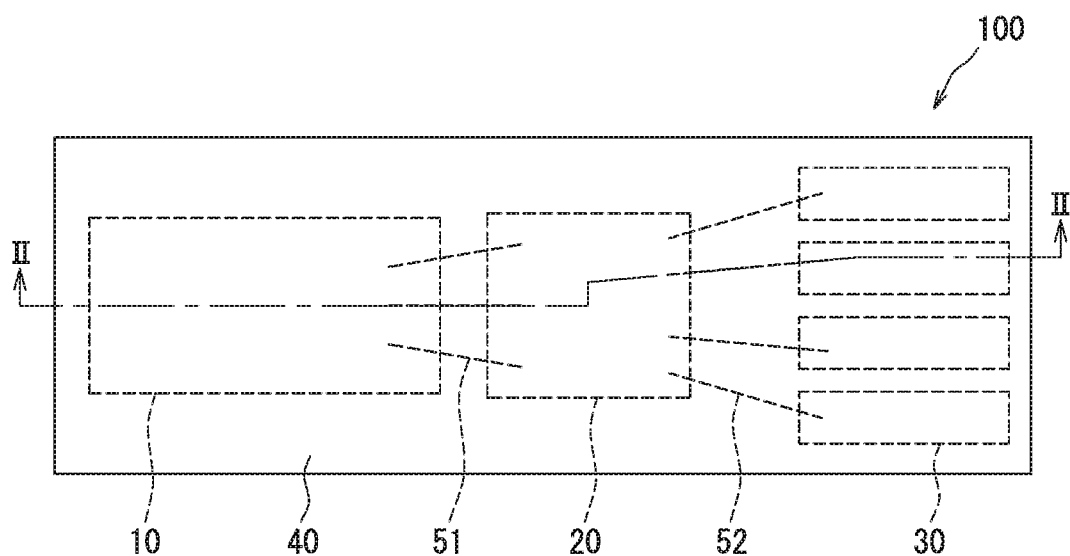
FIG. 1 is a plan view showing a schematic configuration of a semiconductor device in a first embodiment.

In a semiconductor package in which a sensor chip is bonded to a lead frame, and the sensor chip and the lead frame are covered with a resin in a state where a portion of the sensor chip and a portion of the lead frame are exposed, the lead frame and an adhesive material for bonding the sensor chip to the lead frame are required. As a result, the number of components increases. Also, in the case where the sensor chip is placed on the lead frame, a physical size of the semiconductor package is likely to increase.

The present disclosure provides a semiconductor device and a method for producing the semiconductor device which allow reductions in the number of components and a physical size of the semiconductor device.

According to a first aspect of the present disclosure, a semiconductor device includes: a semiconductor element, an electronic component electrically connected to the semiconductor element; a connection member electrically connecting the electronic component to the semiconductor element; and a sealing resin portion having a first surface and a second surface opposite to the first surface and integrally holding the semiconductor element, the electronic component, and the connection member in a state where a semiconductor top surface as a surface of the semiconductor element and a component surface as a surface of the electronic component are exposed from the sealing resin portion on a side adjacent to the first surface.

In the semiconductor device according to the first aspect described above, the semiconductor element, the electronic component, and the connection member are held in the sealing resin portion. Accordingly, there is no need for a lead frame on which a semiconductor element (sensor chip) is to be mounted, an adhesive material for mechanically connecting the lead frame and the semiconductor element, and the like. This can reduce the number of components of the semiconductor device. In addition, a physical size of the semiconductor device can be reduced compared to that when a lead frame is used.

According to a second aspect of the present disclosure, there is provided a method for producing a semiconductor device that includes: a semiconductor element; an electronic component electrically connected to the semiconductor element; a connection member electrically connecting the electronic component to the semiconductor element; and a sealing resin portion having a first surface and a second surface opposite to the first surface and integrally holding the semiconductor element, the electronic component, and the connection member in a state where a semiconductor top surface as a surface of the semiconductor element and a component surface as a surface of the electronic component are exposed from the sealing resin portion on a side adjacent to the first surface. The method includes mounting the semiconductor element and the electronic component on a supporting body. The mounting includes placing, on the supporting body on which an adhesive film is provided, the semiconductor element and the electronic component such that the semiconductor top surface and the component surface come into contact with the adhesive film, and electrically connecting the electronic component to the semiconductor element via the connection member. The method further includes: integrally sealing, after the mounting, the semiconductor element, the electronic component, and the connection member in the sealing resin portion to form a sealed structure; and peeling, after the sealing, the adhesive film from the sealed structure to separate the sealed structure from the supporting body.

The production method according to the second aspect allows a semiconductor device as described above to be produced. In addition, in the production method according to the second aspect described above, there is no need to press a mold die against the semiconductor top surface of the semiconductor element to be exposed from the sealing resin portion. Accordingly, during the production, it is possible to more significantly reduce a stress applied to the semiconductor element than when a mold die is pressed against the semiconductor element and thus suppress breakage.

According to a third aspect of the present disclosure, a semiconductor device includes: a semiconductor element; an electronic component electrically connected to the semiconductor element; a connection member electrically connecting the electronic component to the semiconductor element; a sealing resin portion having a first surface facing a semiconductor top surface as a surface of the semiconductor element and a second surface facing a semiconductor back surface as a surface of the semiconductor element opposite to the semiconductor top surface, the second surface being opposite to the first surface, the sealing resin portion integrally holding the semiconductor element, the electronic component, and the connection member in a state where a portion of the semiconductor top surface is exposed from the sealing resin portion on a side adjacent to the first surface; and a stress relaxation member provided between the semiconductor element and the sealing resin portion and having a linear expansion coefficient or an elastic modulus lower than that of the sealing resin portion. In the sealing resin portion, a distance between the semiconductor top surface and the first surface and a distance between the semiconductor back surface and the second surface are set such that a stress applied from a portion of the sealing resin portion on a semiconductor top surface side to the semiconductor element is equal to a stress applied from a portion of the sealing resin portion on a semiconductor back surface side to the semiconductor element.

In the semiconductor device according to the third aspect, the semiconductor element, the electronic component, and the connection member are integrally held in the sealing resin portion. Accordingly, it is possible to reduce the number of components and a physical size of a semiconductor device. In addition, since the stress relaxation member having the linear expansion coefficient or the elastic modulus lower than that of the sealing resin portion, it is possible to suppress a stress resulting from a linear expansion coefficient difference between the semiconductor element and the sealing resin portion from being applied to the semiconductor element.

Moreover, the distance between the semiconductor top surface and the first surface and the distance between the semiconductor back surface and the second surface are set such that the stress applied from the portion on the semiconductor top surface side to the semiconductor element is equal to the stress applied from the portion on the semiconductor back surface side to the semiconductor element. Accordingly, it is possible to more reliably restrict the semiconductor element from being deformed than when the stress applied from the semiconductor top surface side is different from the stress applied from the semiconductor back surface side.

According to a fourth aspect of the present disclosure, there is provided a method for producing a semiconductor device that includes: a semiconductor element; an electronic component electrically connected to the semiconductor element; a connection member electrically connecting the electronic component to the semiconductor element; a sealing resin portion having a first surface facing a semiconductor top surface as a surface of the semiconductor element and a second surface facing a semiconductor back surface as a surface of the semiconductor element opposite to the semiconductor top surface, the second surface being opposite to the first surface, the sealing resin portion integrally holding the semiconductor element, the electronic component, and the connection member in a state where a portion of the semiconductor top surface is exposed from the sealing resin portion on a side adjacent to the first surface; and a stress relaxation member provided between the semiconductor element and the sealing resin portion and having a linear expansion coefficient or an elastic modulus lower than that of the sealing resin portion. The method includes: mounting the semiconductor element on a supporting body. The mounting includes placing, on the supporting body on which an adhesive film is provided, the semiconductor element such that a portion of the semiconductor top surface comes into contact with the adhesive film, and electrically connecting the electronic component to the semiconductor element via the connection member. The method further includes: applying, after the mounting, the stress relaxation member having the linear expansion coefficient or the elastic modulus lower than that of the sealing resin portion to a portion of the semiconductor element which is not in contact with the adhesive film; integrally sealing, after the applying, the stress relaxation member in addition to the semiconductor element, the electronic component, and the connection member in the sealing resin portion to produce a sealed structure; and peeling, after the sealing, the adhesive film from the sealed structure to separate the sealed structure from the supporting body. In the sealing, the sealed structure is produced in such a manner that a distance between the semiconductor top surface and the first surface and a distance between the semiconductor back surface and the second surface are provided such that, when the sealing resin portion is formed, a stress applied from a portion of the sealing resin portion which is on a semiconductor top surface side to the semiconductor element is equal to a stress applied from a portion of the sealing resin portion which is on a semiconductor back surface side to the semiconductor element.

The production method according to the fourth aspect described above allows a semiconductor device as described above to be produced.

Embodiments of the present disclosure will be described below with reference to the drawings. Note that, in the individual embodiments, a description of parts corresponding to matters described in the previously described embodiment may be omitted by using the same reference numerals to denote the parts. When only a portion of a configuration is described in each of the embodiments, another embodiment described previously can be referred to and applied to the other portion of the configuration.

First Embodiment

Figure 2:
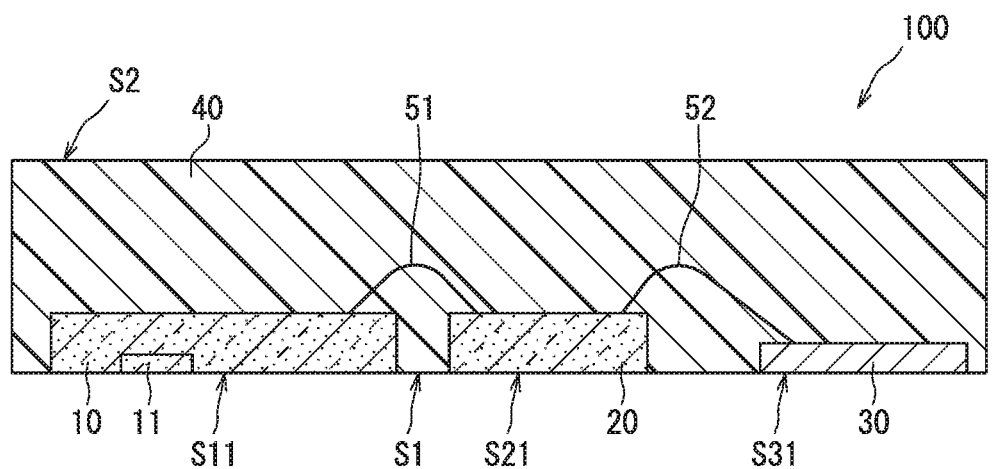
FIG. 2 is a cross-sectional view along a line II-II in FIG. 1.
Figure 3:
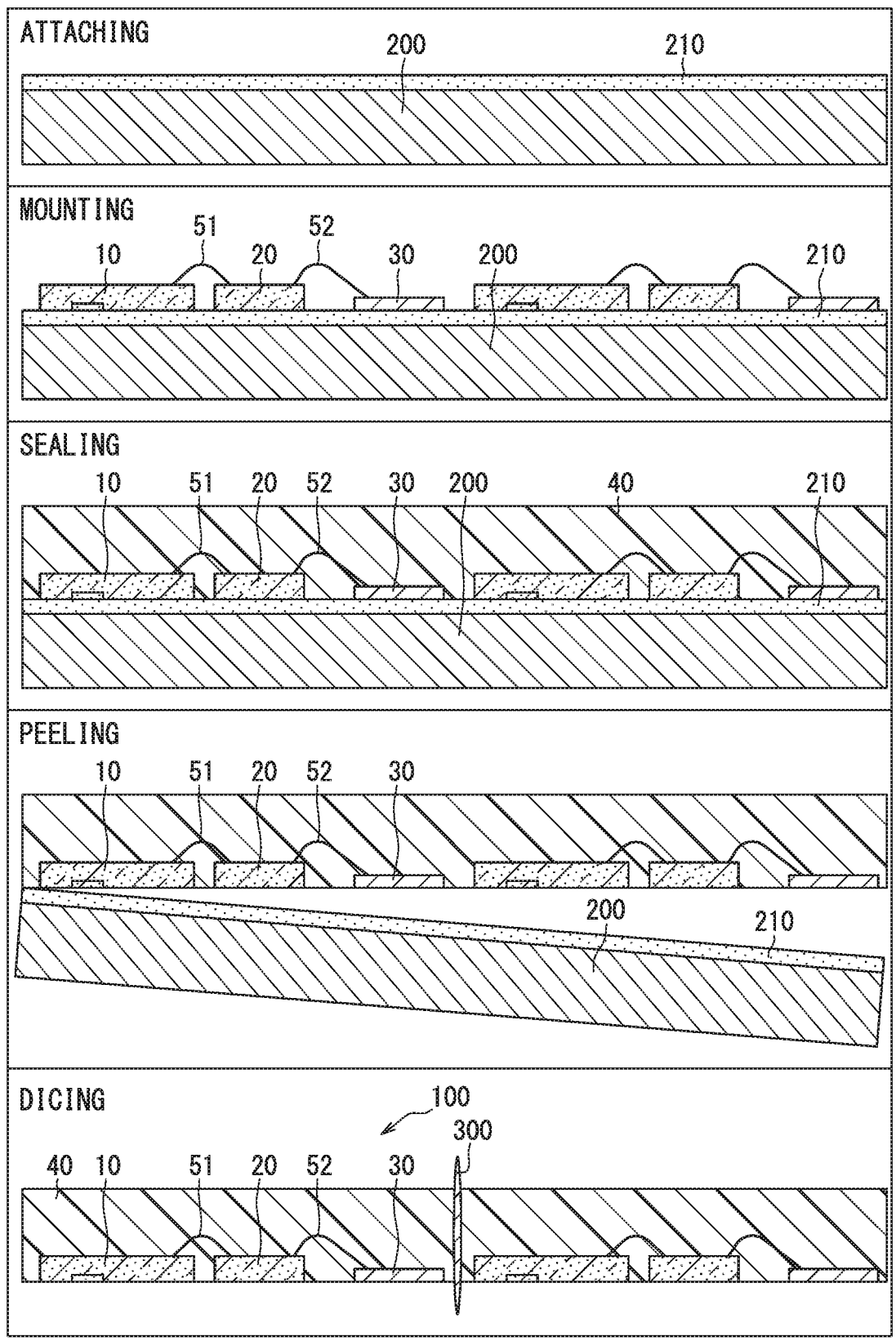
FIG. 3 is a step-by-step cross-sectional view showing a method for producing the semiconductor device in the first embodiment.

With reference to FIGS. 1, 2, and 3, a description will be given of a semiconductor device 100 of the first embodiment and a method for producing the semiconductor device 100. In the present embodiment, by way of example, the semiconductor device 100 including a sensor element 10 which outputs an electric signal according to a physical quantity is used.

First, with reference to FIGS. 1 and 2, a description will be given of a configuration of the semiconductor device 100. The semiconductor device 100 includes the sensor element 10, a control element 20, external connection terminals 30, a sealing resin portion 40, first wires 51, second wires 52, and the like.

The sensor element 10 corresponds to a semiconductor element. As the sensor element 10, for example, a pressure sensor which outputs an electric signal according to a pressure as a physical quantity, an acceleration rate sensor which outputs an electric signal according to an acceleration rate as a physical quantity, or the like can be used. The sensor element 10 includes a sensing portion 11 which detects a physical quantity. In other words, the sensing portion 11 is a portion which outputs an electric signal corresponding to a physical quantity. For example, the sensing portion 11 has a diaphragm structure, a comb-tooth structure, or the like. Note that the electric signal can be referred to also as a sensor signal.

For example, the sensor element 10 has a rectangular parallelepiped shape. One surface (top surface) of the sensor element 10 serves as a semiconductor top surface S11. The semiconductor top surface S11 also includes a surface of the sensing portion 11, i.e., a detection surface.

The control element 20 corresponds to an electronic component and a circuit element. The control element 20 is electrically connected to the sensor element 10 via the wires 51. For example, the control element 20 performs, on the sensor signal, signal processing such as an analog-to-digital conversion process or a filtering process. For example, the control element 20 has a rectangular parallelepiped shape. One surface (top surface) of the control element 20 serves as an element surface S21 as a component surface.

Specifically, on a surface of the sensor element 10 opposite to the semiconductor top surface S11, electrode pads are provided. To the electrode pads of the sensor element 10, the first wires 51 are mechanically and electrically connected. Likewise, on a surface of the control element 20 opposite to the element surface S21, electrode pads are provided. To the electrode pads of the control element 20, the first wires 51 and the second wires 52 are mechanically and electrically connected. Note that each of the first wires 51 and the second wires 52 is formed of a conductive material containing, e.g., gold, copper, aluminum, or the like.

Note that, as shown in FIG. 1, the sensor element 10 and the control element 20 are electrically connected via the three first wires 51, for example, in the present embodiment. However, the present disclosure is not limited thereto. The sensor element 10 and the control element 20 may also be electrically connected via the two or less first wires 51 or the four or more first wires 51. Alternatively, the sensor element 10 and the external connection terminals 30 may also be directly connected without interposition of the circuit element therebetween.

Each of the external connection terminals 30 corresponds to an electronic component. The external connection terminal 30 is formed of a conductive material containing, e.g., copper, aluminum, iron, or the like. The external connection terminals 30 are electrically connected to the control element 20 via the second wires 52. Consequently, the external connection terminals 30 are electrically connected to the sensor element 10 via the second wires 52, the control element 20, and the first wires 51. The external connection terminals 30 are terminals for electrically connecting the control element 20 and an external element provided outside the sealing resin portion 40. The external element may be referred to also as an electronic device provided separately from the semiconductor device 100.

Each of the external connection terminals 30 includes a portion having, e.g., a rectangular parallelepiped shape. One surface (top surface) of each of the external connection terminals 30 serves as a terminal surface S31 as the component surface.

Note that, as shown in FIG. 1, the four external connection terminals 30 are provided, for example, in the present embodiment. However, the present disclosure is not limited thereto. The three or less external connection terminals 30 or the four or more external connection terminals 30 may also be provided.

The sealing resin portion 40 is formed of an electrically insulating resin such as a silicone resin or an epoxy resin. The sealing resin portion 40 seals and integrally holds the sensor element 10, the control element 20, the external connection terminals 30, the first wires 51, and the second wires 52. Thus, the sensor element 10, the control element 20, the external connection terminals 30, the first wires 51, and the second wires 52 are sealed in the sealing resin portion 40, and can therefore be referred to also as sealed components.

The sealing resin portion 40 has one surface (first surface) S1 and an opposite surface (second surface) S2 opposite to the one surface S1 and has, for example, a rectangular parallelepiped shape. For example, the one surface S1 and the opposite surface S2 are planar surfaces. The sealing resin portion 40 seals the sensor element 10, the control element 20, the external connection terminals 30, the first wires 51, and the second wires 52 in a state where the semiconductor top surface S11, the element surface S21, and the terminal surfaces S31 are exposed at the one surface S1. Thus, the semiconductor device 100 is a sealed structure having the semiconductor top surface S11, the element surface S21, and the terminal surfaces S31 which are exposed in the same direction.

Consequently, the sensor element 10 is covered with the sealing resin portion 40 in a state where the surfaces of the sensor element 10 other than the semiconductor top surface S11 are in contact with the sealing resin portion 40. The same applies also to the control element 20 and the external connection terminals 30. Also, the first wires 51 are covered with the sealing resin portion 40 in a state where the portions of the first wires 51 other than the portions thereof connected to the sensor element 10 and the control element 20 are in contact with the sealing resin portion 40. The same applies also to the second wires 52.

In the semiconductor device 100, the one surface S1, the semiconductor top surface S11, the element surface S21, and the terminal surfaces S31 are flush with each other. In other words, it can be said that the semiconductor top surface S11, the element surface S21, and the terminal surfaces S31 are provided on a virtual plane extending through the one surface S1. However, the present disclosure is not limited thereto. The individual surface S11, S21, and S31 need not necessarily be flush with each other. In other words, each of the surfaces S11, S21, and S31 need not necessarily be a planar surface.

Note that, in the present embodiment, the semiconductor top surface S11, the element surface S21, and the terminal surfaces S31 are exemplarily exposed at the one surface S1. However, the present disclosure is not limited thereto. It is only required that at least the semiconductor top surface S11 and the terminal surface S31 are exposed at the one surface S1.

Thus, in the semiconductor device 100, the semiconductor top surface S11 is exposed from the sealing resin portion 40. Accordingly, a detection sensitivity of the sensor element 10 can be improved compared to that when the semiconductor top surface S11 is covered with the sealing resin portion 40 or the like. In addition, in the semiconductor device 100, each of the terminal surfaces S31 is exposed from the sealing resin portion 40. This allows electrical connection with the external element to be easily achieved.

Also, in the semiconductor device 100, the sealing resin portion 40 integrally holds the sensor element 10, the control element 20, and the external connection terminals 30 without using a lead frame or an adhesive material. The sealing resin portion 40 also holds the first wires 51 and the second wires 52 in addition to the sensor element 10, the control element 20, and the external connection terminals 30. Therefore, it can be said that the sealing resin portion 40 has a function of protecting the sensor element 10, the control element 20, and the like from an impact, a temperature, a humidity, and light and a function of holding the sensor element 10, the control element 20, and the like.

It can also be said that the sensor element 10, the control element 20, and the external connection terminals 30 are mechanically connected by the sealing resin portion 40 without interposition of a lead frame. In other words, the sensor element 10, the control element 20, and the external connection terminals 30 are fixed by the sealing resin portion 40 without interposition of a lead frame. It can also be said that the sealing resin portion 40 functions as a connector for integrating the sensor element 10, the control element 20, and the external connection terminals 30 with each other. It can also be said that the sealing resin portion 40 has a function of integrating the individual sealed components with each other.

With reference to FIG. 3, a description will be given of a method for producing the semiconductor device 100. In the present embodiment, by way of example, a production method in which a plurality of the semiconductor devices 100 are simultaneously produced is used. However, a method used in the present disclosure is not limited thereto.

In the present production method, a supporting body 200, an adhesive film 210, and a dicing blade 300 are used.

The supporting body 200 is a member which supports the sensor element 10, the control element 20, and the external connection terminals 30 via the adhesive film 210. The supporting body 200 is a member in the form of a flat plate which is configured to contain, e.g., stainless steel or the like, and includes a planar adhesion target surface to which the adhesive film 210 is to be bonded. Note that a constituent material of the supporting body 200 is not particularly limited. However, when the adhesive film 210 is to be peeled using UV radiation in a peeling step described later, the supporting body 200 is formed of a material which transmits UV light.

As the adhesive film 210, a heat-resistant sticky tape or a UV-cured film can be used. The adhesive film 210 has such a heat resistant property as to be usable at a temperature during a sealing step. The adhesive film 210 also has a property which restricts the sealing resin portion 40 from escaping between respective bonded surfaces of the sensor element 10 and the adhesive film 210 and which does not affect mounting of the sensor element 10 onto the adhesive film 210 and a wire bonding property.

The adhesive film 210 can be adhered to the one surface S1, the semiconductor top surface S11, the element surface S21, and the terminal surfaces S31 to be lightly peelable therefrom. A lightly peelable state refers to a state in which, when the adhesive film 210 adhered to the sealing resin portion 40 is peeled therefrom, the adhesive film 210 leaves no residue on the sealing resin portion 40. The lightly peelable state can be referred to also as a state in which the adhesive film 210 is adhered to the sealing resin portion 40 at 100 mN/25 mm or less.

The dicing blade 300 is a division tool used to divide the sealed structure in which the plurality of semiconductor devices 100 are integrated with each other into the individual semiconductor devices 100.

In the present production method, an attaching step, a mounting step, the sealing step, the peeling step, and a dicing step are performed in this order.

In the attaching step, as shown in a first row from the top in FIG. 3, the adhesive film 210 is attached to the adhesion target surface of the supporting body 200. At this time, the adhesive film 210 is attached thereto such that a surface of the adhesive film 210 opposite to the adhesion target surface is lightly peelable.

In the mounting step, as shown in a second row from the top in FIG. 3, on the supporting body 200 on which the adhesive film 210 has been provided, the sensor elements 10, the control elements 20, and the external connection terminals 30 are placed such that each of the surfaces S11, S21, and S31 comes into contact with the adhesive film 210. Specifically, in the mounting step, the sensor elements 10, the control elements 20, and the external connection terminals 30 are placed on the adhesive film 210 to adhere each of the surfaces S11, S21, and S31 to the adhesive film 210. In other words, in the mounting step, each of the surfaces S11, S21, and S31 is adhered directly to the adhesive film 210. It can also be said that, in the mounting step, the sensor elements 10, the control elements 20, and the external connection terminals 30 are temporarily fixed using the adhesive film 210.

In the present embodiment, during the sealing step, there is no need to press a mold die against the sensor elements 10 or the like. Accordingly, positional accuracy required when the sensor elements 10 and the like are placed on the adhesive film 210 in the mounting step is lower than that required when a mold die is pressed against the sensor elements 10 or the like during the sealing step. As a result, in the mounting step, the sensor elements 10 and the like can be placed more easily than when a mold die is pressed against the sensor elements or the like during the sealing step.

Note that, in the mounting step, the sensor elements 10 may also be placed on the adhesive film 210 in a state where a water-repellent film is applied to the semiconductor top surface S11. This can further restrict the adhesive film 210 from adhering tightly to the detection surfaces at the semiconductor top surface S11 in the mounting step. The adhesive film 210 is adhered to the semiconductor top surface S11 so as to be lightly peelable therefrom. However, it can also be considered that the adhesive film leaves residues on the semiconductor top surface S11 when peeled from the semiconductor top surface S11. Accordingly, in the mounting step, the water-repellent film is used so as to more reliably restrict the adhesive film 210 from leaving residues on the detection surfaces of the sensor elements 10.

Also, in the mounting step, the sensor elements 10, the control elements 20, and the external connection terminals 30 each adhered to the adhesive film 210 are electrically connected. In other words, in the mounting step, the sensor elements 10 and the control elements 20 are electrically connected via the first wires 51, while the control elements 20 and the external connection terminals 30 are electrically connected via the second wires 52. Thus, in the mounting step, wire bonding is performed using the first wires 51 and the second wires 52 to electrically and mechanically connect the sensor elements 10 and the control elements 20 and electrically and mechanically connect the control elements 20 and the external connection terminals 30.

As the first wires 51 and the second wires 52, wires each containing aluminum as a main component are used to be able to reduce thermal influence on the adhesive film 210. Specifically, by using wires each containing aluminum as a main component as the first wires 51 and the second wires 52, during the wire bonding, it is possible to restrict heat from causing a failure in the adhesive film 210.

Note that, in the present embodiment, to facilitate handling after the wire bonding, the supporting body 200 is used. Accordingly, when it is possible to place the adhesive film 210 on a planar surface of a support stand or the like and perform the steps including and subsequent to the mounting step, there is no need for the supporting body 200 and the attaching step. In other words, when there is a mechanism of fixing the adhesive film 210 on a facility side, there is no need for the supporting body 200.

In the sealing step after the mounting step, as shown in a third row from the top in FIG. 3, the sensor elements 10, the control elements 20, the external connection terminals 30, the first wires 51, and the second wires 52 are integrally sealed in the sealing resin portion 40 to produce the sealed structure. The sealing step is performed using, for example, a mold die having a cavity corresponding to an outer shape of the sealing resin portion 40. In the sealing step, the mold die is placed such that the sensor elements 10, the control elements 20, the external connection terminals 30, the first wires 51, and the second wires 52 are placed in the cavity. Then, in this state, the cavity is filled with a constituent material of the sealing resin portion 40 to form the sealing resin portion 40. Accordingly, the sealing resin portion 40 can be referred to as also a mold resin.

In the peeling step after the sealing step, as shown in a fourth row from the top in FIG. 3, the adhesive film 210 is peeled from the sealed structure to separate the sealed structure from the supporting body 200. As described above, the adhesive film 210 is adhered to the one surface S1 or the like to be lightly peelable therefrom. Accordingly, in the peeling step, a force is applied to either one of the sealed structure and the supporting body 200 in a direction which brings the sealed structure further away from the supporting body 200 to which the adhesive film 210 is adhered so as to enable the adhesive film 210 to be peeled off from the sealed structure.

Also, in the peeling step, when a UV-cured film is used as the adhesive film 210, UV light is applied to the surface of the supporting body 200 opposite to the adhesion target surface to thus reduce an adhesive force of the adhesive film 210. Then, in the peeling step, after the adhesive force of the adhesive film 210 is reduced, the adhesive film 210 is peeled from the sealed structure. A method of peeling the adhesive film 210 is not limited thereto. For example, the adhesive film 210 may also be peeled from the sealed structure such as by foaming the adhesive film 210 and thus reducing the adhesive force of the adhesive film 210.

In the dicing step after the peeling step, as shown in a fifth row from the top in FIG. 3, using the dicing blade 300, the sealed structure is divided into the plurality of semiconductor devices 100. Note that, when the production method in which the plurality of semiconductor devices 100 are simultaneously produced from one sealed structure is not used, there is no need for the dicing step.

As described above, in each of the semiconductor devices 100, the sensor element 10, the control element 20, the external connection terminals 30, the first wires 51, and the second wires 52 are held in the sealing resin portion 40. Accordingly, in the semiconductor device 100, there is no need for a lead frame on which a sensor element (sensor chip) is to be mounted, an adhesive material for mechanically connecting a lead frame and a sensor element, and the like, and the number of components can be reduced. Since the semiconductor device 100 does not have a lead frame, the physical size thereof can be reduced compared to that when a lead frame is used.

When a sensor element is mounted on a lead frame via an adhesive material, in a semiconductor device, it is necessary to ensure a bonding allowance for mounting accuracy and for protrusion of the adhesive material, and accordingly a volume of the sealing resin portion is increased. By contrast, in the semiconductor device 100, there is no need to ensure the bonding allowance, and accordingly the volume of the sealing resin portion 40 can be reduced compared to that when a lead frame is used. As a result, in the semiconductor device 100, it is possible to reduce a stress resulting from a linear expansion coefficient difference between the sensor element 10 and the sealing resin portion 40.

Also, in the present production method, the semiconductor device 100 as described above can be produced. In addition, in the present production method, there is no need to press a mold die against the semiconductor top surface S11 of the sensor elements 10 to be exposed from the sealing resin portion 40. Accordingly, during the production, the present production method can more significantly reduce a stress applied to the sensor element 10 than when a mold die is pressed against the sensor element 10 and thus suppress breakage.

While the embodiment of the present disclosure has been described theretofore, the present disclosure is by no means limited to the embodiment described above, and can variously be modified within the scope not departing from the gist of the present disclosure. The following will describe, as other embodiments, second to tenth embodiments. Each of the embodiment described above and the second to tenth embodiments can solely be implemented, but the embodiment described above and the second to tenth embodiments can also be combined appropriately and implemented. The present disclosure is not limited to combinations shown in the embodiments, but can be implemented in various combinations.

Second Embodiment

Figure 4:
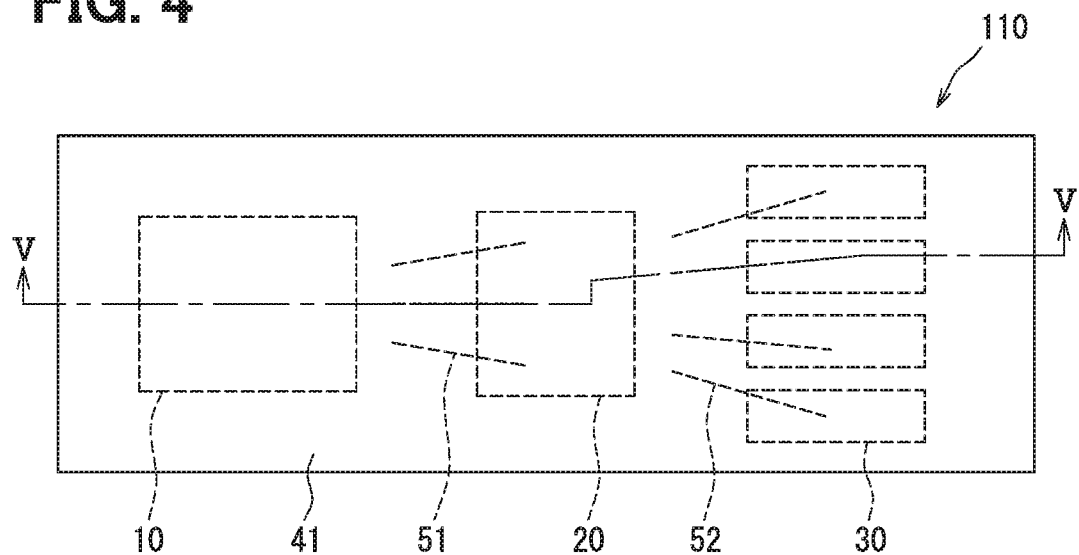
FIG. 4 is a plan view showing a schematic configuration of a semiconductor device in a second embodiment.
Figure 5:
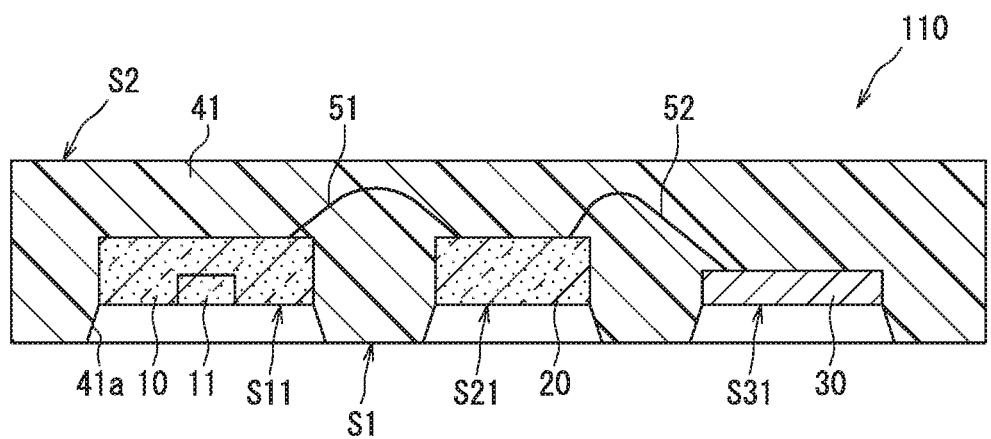
FIG. 5 is a cross-sectional view along a line V-V in FIG. 4.

Using FIGS. 4, 5, and 6, a description will be given of a semiconductor device 110 of the second embodiment and a method for producing the semiconductor device 110. A description is given herein of the second embodiment with emphasis on portions different from those in the first embodiment. In the semiconductor device 110, the same parts as those of the semiconductor device 100 are denoted by the same reference numerals. As for the components denoted by the same reference numerals as used for the semiconductor device 100, the embodiment described above can be referred to and applied to the second embodiment.

The semiconductor device 110 is different from the semiconductor device 100 in terms of a shape of the sealing resin portion 41. As shown in FIG. 4, the semiconductor device 110 is the same as the semiconductor device 100 in terms of a two-dimensional shape thereof viewed from the opposite surface S2 side. However, as shown in FIG. 5, in the semiconductor device 110, recessed portions 41a are provided in the sealing resin portion 41. Specifically, in the sealing resin portion 41, the recessed portions 41a are provided to be recessed from the one surface S1 to respective positions reaching the semiconductor top surface S11, the element surface S21, and the terminal surfaces S31. It can also be said that, in the semiconductor device 110, bottomed holes having the surfaces S11, S21, and S31 as respective bottom surfaces thereof are provided in the sealing resin portion 41.

It can also be said that the semiconductor device 110 includes the sealing resin portion 41 in which respective peripheries of the individual surfaces S11, S21, and S31 protrude from the surfaces S11, S21, and S31. Consequently, in the semiconductor device 110, between the plurality of external connection terminals 30, portions protruding from the terminal surfaces S31 each as a portion of the sealing resin portion 41 are provided. In other words, between the adjacent terminal surfaces S31, the protruding portions of the sealing resin portion 41 are interposed.

The recessed portions 41a are each surrounded by four contiguous wall surfaces of the sealing resin portion 41 in correspondence to respective two-dimensional shapes of the individual surfaces S11, S21, and S31. Accordingly, it can be said that the semiconductor device 110 has a configuration in which five surfaces including the four contiguous wall surfaces of the sealing resin portion 41 defining each of the recessed portions 41a and the semiconductor top surface S11 are exposed. In this point, the same applies also to the respective portions of the element surface S21 and the terminal surfaces S31. Thus, in the semiconductor device 110, the individual surfaces S11, S21, and S31 are not flush with the one surface S1.

Note that each of the recessed portions 41a may also have an aperture area which decreases with distance from the one surface S1 toward the surface S11, S21, or S31. In particular, the recessed portion 41a facing the semiconductor top surface S11 preferably has such an aperture area.

Figure 6:
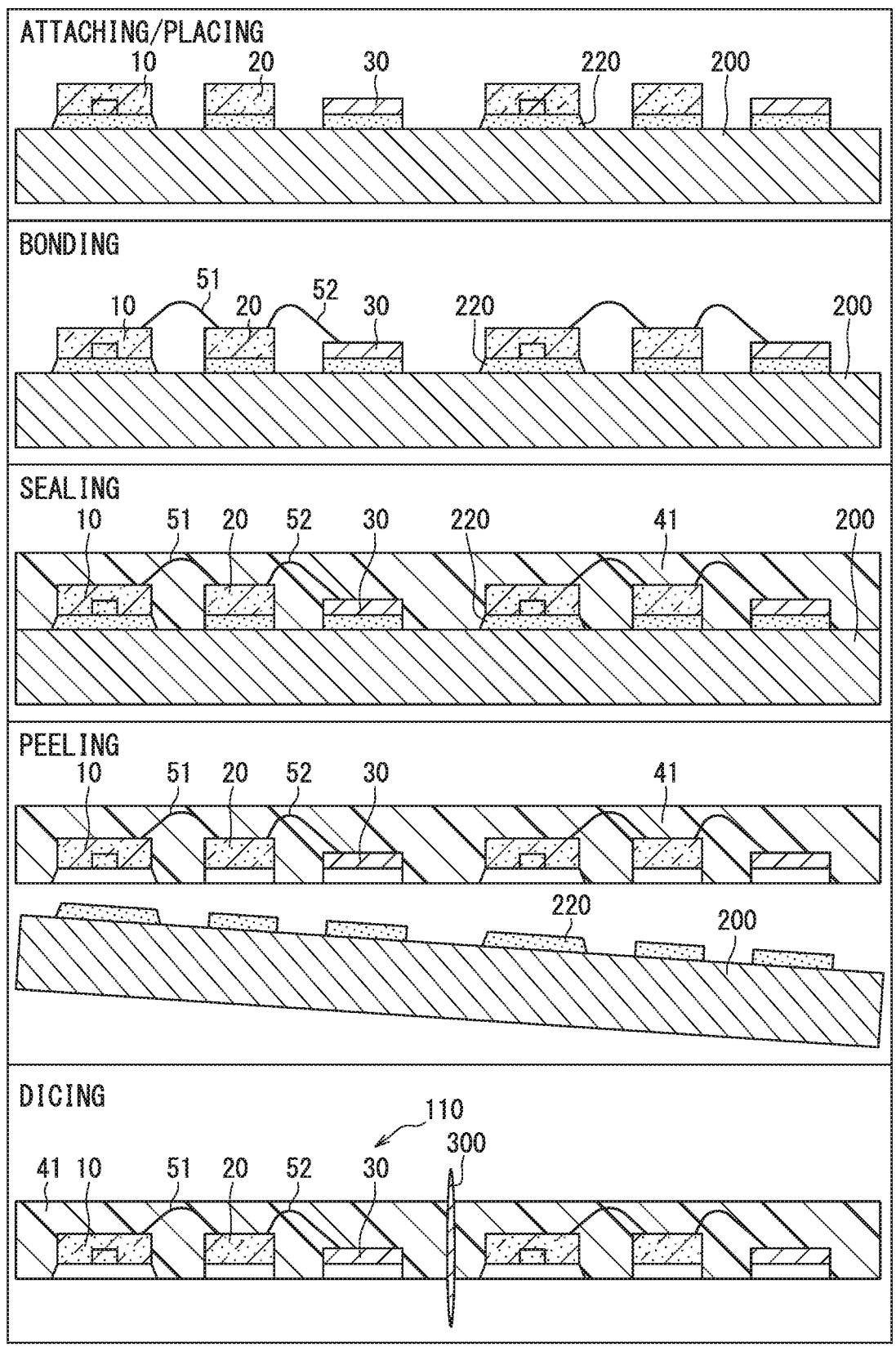
FIG. 6 is a step-by-step cross-sectional view showing a method for producing the semiconductor device in the second embodiment.

With reference to FIG. 6, a description will be given herein of the method for producing the semiconductor device 110.

In the attaching step, as shown in a first row from the top in FIG. 6, adhesive films 220 are attached to the adhesion target surface of the supporting body 200. In this case, each of the adhesive films 220 is attached such that a surface thereof opposite to the adhesion target surface is lightly peelable, as described above. Also, in the present production method, the adhesive films 220 having shapes corresponding to the shapes of the recessed portions 41a are used. Specifically, in the attaching step, the adhesive films 220 having thicknesses corresponding to respective depths of the recessed portions 41a are provided only on the respective portions corresponding to the individual surfaces S11, S21, and S31.

It is possible to conform the adhesive films 220 to the shapes of the recessed portions 41a, for example, by attaching the sheet-like adhesive film 220 onto the supporting body 200 and then partially removing the adhesive film 220. Note that, in the attaching step, a plurality of the adhesive films 220 having the shapes corresponding to the shapes of the recessed portions 41a may also be attached onto the supporting body 200.

In the placing step, as shown in the first row from the top in FIG. 6, on the supporting body 200 on which the adhesive films 220 are provided, the sensor elements 10, the control elements 20, and the external connection terminals 30 are placed such that the individual surfaces S11, S21, and S31 come into contact with the respective adhesive films 220. In other words, in the placing step, the sensor elements 10, the control elements 20, and the external connection terminals 30 are placed on the adhesive films 220 to adhere the individual surfaces S11, S21, and S31 to the respective adhesive films 220.

Then, as shown in a second row from the top in FIG. 6, the bonding step is performed. The bonding step is the same as the step described in the mounting step of the first embodiment. Note that, in the description given in the present embodiment, it is assumed that the placing step and the bonding step are different steps. However, the placing step and the bonding step correspond to the mounting step.

In the stealing step, as shown in a third row from the top in FIG. 6, a cavity of a mold die is filled with the constituent material of the sealing resin portion 41 to form the sealing resin portion 41. The sealing step is the same as that of the first embodiment. However, as described above, the adhesive films 220 are provided only on the portions facing the individual surfaces S11, S21, and S31. Accordingly, the sealing resin portion 41 is formed also around each of the adhesive films 220.

Note that the peeling step shown in a fourth row from the top in FIG. 6 and the dicing step shown in a fifth row from the top in FIG. 6 are the same as those of the first embodiment, and therefore the first embodiment can be referred to.

The semiconductor device 110 can achieve the similar effects as achieved by the semiconductor device 100. In addition, in the semiconductor device 110, between the plurality of external connection terminals 30, the portions of the sealing resin portion 41 protruding from the terminal surfaces S31 are provided. This can restrict short circuits between the plurality of external connection terminals 30.

In the semiconductor device 110, in a case where an object to be detected by the sensor element 10 is a fluid, when the aperture area of the recessed portion 41a decreases with distance from the one surface S1 toward the semiconductor top surface S11, the fluid is easily supplied to the sensor element 10. Consequently, in the semiconductor device 110, detection accuracy can be improved compared to that when the recessed portion 41a is not provided.

Also, the present production method can achieve the similar effects as achieved by the production method for the semiconductor device 100. In addition, in the present production method, the sealing step is performed using the adhesive films 220 having the shapes corresponding to the shapes of the recessed portions 41a to allow the recessed portions 41a to be easily formed.

Note that, in the present embodiment, the recessed portions 41a are formed using the shapes of the adhesive films 220, as an example. However, the present disclosure is not limited thereto, and the recessed portions 41a may also be formed by removing the sealing resin portion 41 using a laser or the like.

Third Embodiment

Figure 7:
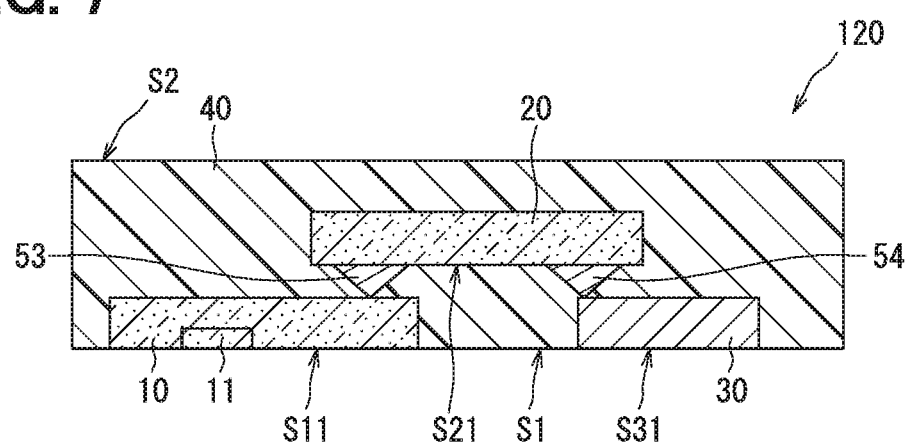
FIG. 7 is a cross-sectional view showing a schematic configuration of a semiconductor device in a third embodiment.
Figure 8:
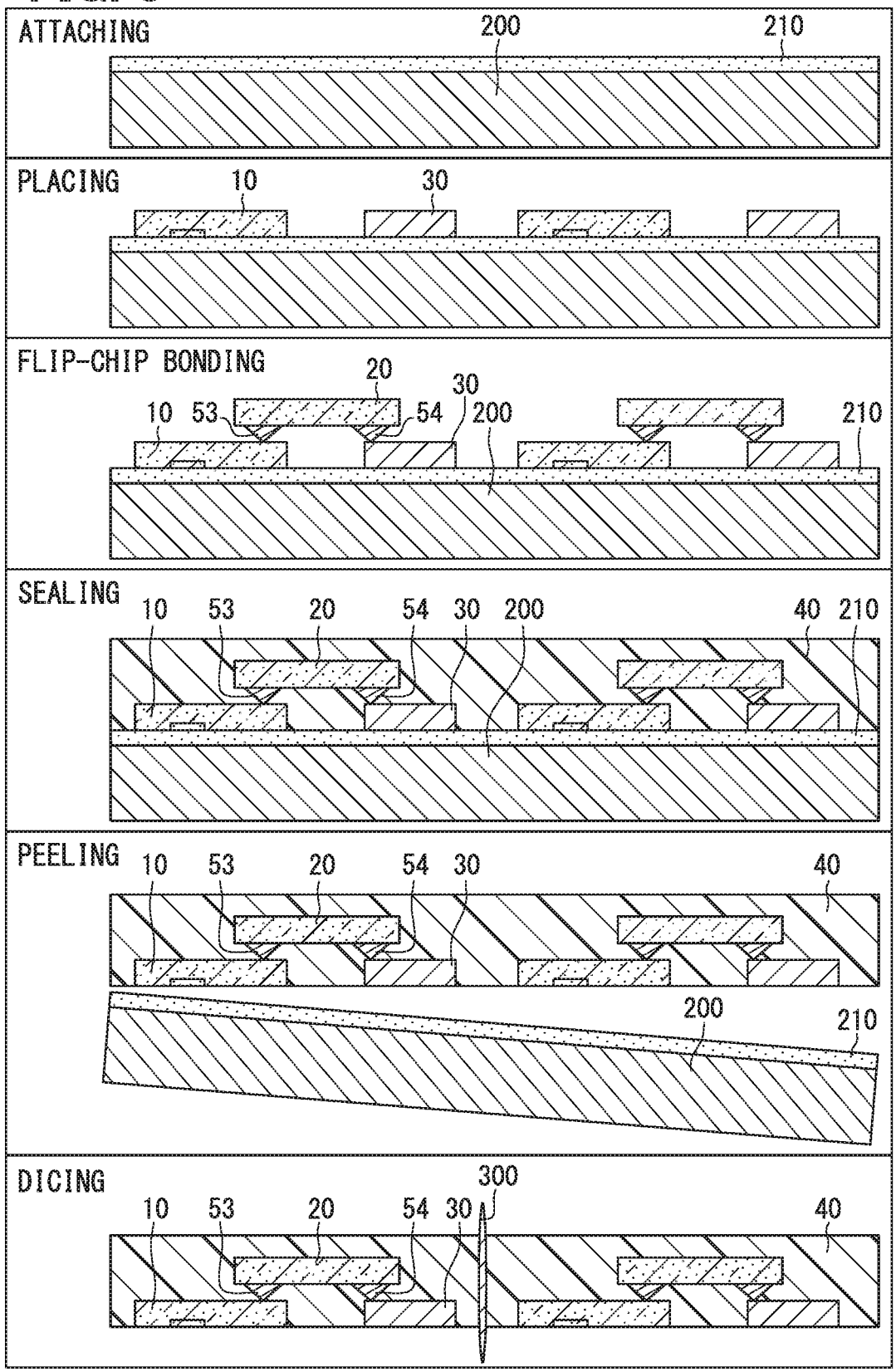
FIG. 8 is a step-by-step cross-sectional view showing a method for producing the semiconductor device in the third embodiment.

With reference to FIGS. 7 and 8, a description will be given of a semiconductor device 120 of the third embodiment and a method for producing the semiconductor device 120. A description is given herein of the third embodiment with emphasis on portions different from those in the first embodiment. In the semiconductor device 120, the same parts as those of the semiconductor device 100 are denoted by the same reference numerals. As for the components denoted by the same reference numerals as used for the semiconductor device 100, the embodiment described above can be referred to and applied to the third embodiment.

The semiconductor device 120 is different from the semiconductor device 100 in terms of a structure in which the sensor element 10 is electrically connected to the control element 20, and the control element 20 is electrically connected to the external connection terminal 30. As shown in FIG. 7, the control element 20 is placed to be stacked relative to the sensor element 10 and the external connection terminal 30. The control element 20 faces a portion of the sensor element 10 in a direction perpendicular to the one surface S1, while facing the external connection terminal 30 in the direction perpendicular to the one surface S1.

The control element 20 is electrically connected to the sensor element 10 via a first bump 53. The control element 20 is also electrically connected to the external connection terminal 30 via a second bump 54. The control element 20 is mounted to be stacked on the sensor element 10 and the external connection terminal 30 via the first pump 53 and the second bump 54. The control element 20, which is thus mounted, is covered with the sealing resin portion 40.

Note that each of the first bump 53 and the second bump 54 corresponds to a connection member. Each of the first bump 53 and the second bump 54 contains a conductive material, such as gold or silver, as a main component. A constituent material of each of the first bump 53 and the second bump 54 may also be determined selectively based on an upper-temperature limit of the adhesive film 210.

In the semiconductor device 120, the semiconductor top surface S11 and the terminal surface S31 are exposed at the one surface S1. In other words, in the semiconductor device 120, the element surface S21 is not exposed at the one surface S1. The control element 20 is sealed in the sealing resin portion 40 without being exposed from the sealing resin portion 40.

With reference to FIG. 8, a description will be given herein of the method for producing the semiconductor device 120.

As shown in a first row from the top in FIG. 8, the attaching step is the same as that of the first embodiment. In the placing step, as shown in a second row from the top in FIG. 8, the sensor elements 10 and the external connection terminals 30 are mounted on the adhesive film 210. In this case, the control elements 20 are not mounted on the adhesive film 210.

Then, in a flip-chip bonding step, on the sensor elements 10 and the external connection terminals 30, the control elements 20 are mounted via the first bumps 53 and the second bumps 54. As a result, the control elements 20 and the sensor elements 10 are electrically connected by the first bumps 53, while the control elements 20 and the external connection terminals 30 are electrically connected by the second bumps 54.

Note that, in the description given in the present embodiment, it is assumed that the placing step and the flip-chip bonding step are different steps. However, the placing step and the flip-chip bonding step correspond to the mounting step.

In the present production method, the sealing step, the peeling step, and the dicing step are performed thereafter, in the same manner as in the first embodiment.

The semiconductor device 120 can achieve the similar effects as achieved by the semiconductor device 100. In addition, in the semiconductor device 120, the control element 20 is stacked on the sensor element 10 and the external connection terminal 30, and therefore the physical size of the semiconductor device 120 in a direction along the one surface S1 can be reduced compared to that of the semiconductor device 100. Moreover, in the semiconductor device 120, the control element 20 is covered with the sealing resin portion 40 without being exposed, and therefore protection performance for the control element 20 can be improved compared to that in the semiconductor device 100. In other words, in the semiconductor device 120, the control element 20 can more easily be protected from an impact, a temperature, a humidity, and light than in the semiconductor device 100. Note that the present production method can achieve the similar effects as those achieved in the first embodiment.

Note that the third embodiment can also be implemented by being combined with the second embodiment. Specifically, in the semiconductor device 120, the recessed portions 41a may also be provided in the respective portions facing the semiconductor top surface S11 and the terminal surface S31. This allows the semiconductor device 120 to achieve the similar effects to those achieved by the semiconductor device 110.

Fourth Embodiment

Figure 9:
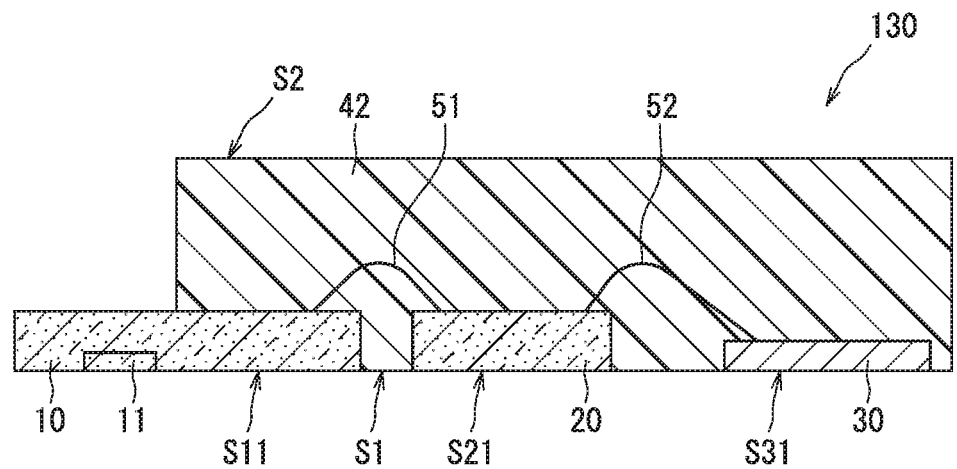
FIG. 9 is a cross-sectional view showing a schematic configuration of a semiconductor device in a fourth embodiment.

With reference to FIG. 9, a description will be given of a semiconductor device 130 of the fourth embodiment. A description is given herein of the fourth embodiment with emphasis on portions different from those in the first embodiment. In the semiconductor device 130, the same parts as those of the semiconductor device 100 are denoted by the same reference numerals. As for the components denoted by the same reference numerals as used for the semiconductor device 100, the embodiment described above can be referred to and applied to the fourth embodiment.

The semiconductor device 130 is different from the semiconductor device 100 in terms of a shape of a sealing resin portion 42. As shown in FIG. 9, the sealing resin portion 42 has the shape in which, in addition to the semiconductor top surface S11 of the sensor element 10, another portion is also exposed. In other words, the sealing resin portion 42 has a side surface contiguous to the surface S2 opposite to the one surface S1. In addition, the sensor element 10 is provided such that a portion thereof including the sensing portion 11 protrudes from the side surface of the sealing resin portion 42.

Note that, in the same manner as in the production method of the first embodiment, the semiconductor device 130 can be produced by forming the sealing resin portion 42 such that the portions of the sensor element 10 other than the semiconductor top surface S11 are covered with the sealing resin portion 42, and then removing the sealing resin portion 42 from over the sensor element 10.

The semiconductor device 130 can achieve the similar effects as achieved by the semiconductor device 100. In addition, in the semiconductor device 130, the portion of the sensor element 10 including the sensing portion 11 protrudes from the side surface of the sealing resin portion 42. Accordingly, it is possible to suppress a stress resulting from a linear expansion coefficient difference between the sensor element 10 and the sealing resin portion 42 from being applied to the sensing portion 11. Therefore, in the semiconductor device 130, detection accuracy can be improved compared to that in the semiconductor device 100.

Note that the fourth embodiment can also be implemented by being combined with each of the second and third embodiments. This allows the semiconductor device 130 to achieve the similar effects as achieved by the corresponding one of the semiconductor devices 110 and 120.

Fifth Embodiment

Figure 10:
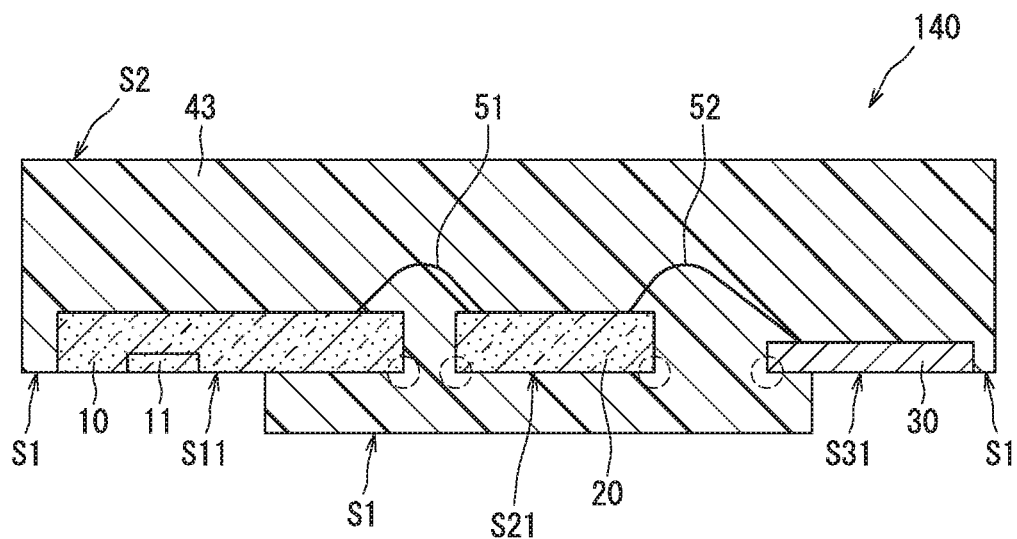
FIG. 10 is a cross-sectional view showing a schematic configuration of a semiconductor device in a fifth embodiment.

With reference to FIG. 10, a description will be given of a semiconductor device 140 of the fifth embodiment. A description is given herein of the fifth embodiment with emphasis on portions different from those in the first embodiment. In the semiconductor device 140, the same parts as those of the semiconductor device 100 are denoted by the same reference numerals. As for the components denoted by the same reference numerals as used for the semiconductor device 100, the embodiment described above can be referred to and applied to the fifth embodiment.

The semiconductor device 140 is different from the semiconductor device 100 in terms of a shape of a sealing resin portion 43. As shown in FIG. 10, the sealing resin portion 43 has the shape in which the control element 20 is not exposed.

In the semiconductor device 140, the sensor element 10, the control element 20, and the external connection terminal 30 are arranged side by side in a direction parallel with the one surface S1. Specifically, the sensor element 10, the control element 20, and the external connection terminal 30 are placed such that the individual surfaces S11, S21, and S31 are flush with each other.

The sealing resin portion 43 is provided on the one surface S1 side and the opposite surface S2 side of the control element 20. In other words, the sealing resin portion 43 includes, at a position facing the element surface S21 of the control element 20, a portion protruding from each of the semiconductor top surface S11 and the terminal surface S31. The sealing resin portion 43 covers the control element 20 without exposing the control element 20 to the outside. Alternatively, the sealing resin portion 43 may also include the protruding portions between the external connection terminals 30, similarly to the sealing resin portion 40. Still alternatively, as shown by broken-line circles in FIG. 10, it may also be possible to cover end portions of the sensor element 10 and the like with a resin or a resin sheet so as to suppress a stress from being concentrated on the end portions of the sensor element 10 and the like. Thus, to avoid breaking influence on wire bonding resulting from advancement of interfacial delamination between the sensor element 10 and the sealing resin portion 43, it may also be possible to reduce a stress in a shearing direction of the interface between each of the sensor element 10 and the control element 20 and the sealing resin portion 43.

Note that the semiconductor device 140 can be produced by disposing the adhesive films 210 only at respective positions facing the semiconductor top surface S11 and the terminal surface S31 and performing the sealing step.

The semiconductor device 140 can achieve the similar effects as achieved by the semiconductor devices 100 and 120. For the semiconductor device 140, even the control element 20 of a surface-mounted type can also be used. Also, in the semiconductor device 140, the sealing resin portion 43 has the protrusion at the position facing the control element 20, and therefore it is possible to restrict deformation resulting from a linear expansion coefficient difference between each of the sensor element 10 and the control element 20 and the sealing resin portion 43.

Note that the fifth embodiment may also be implemented by being combined with any of the second to fourth embodiments. This allows the semiconductor device 140 to achieve the similar effects as achieved by the corresponding one of the semiconductor devices 110 to 130. For example, when the fifth embodiment is combined with the second embodiment, in the semiconductor device 140, portions of the sealing resin portion 43 protruding from the semiconductor top surface S11 and the terminal surface S31 may be provided around the semiconductor top surface S11 or between the plurality of external connection terminals 30.

Sixth Embodiment

Figure 11:
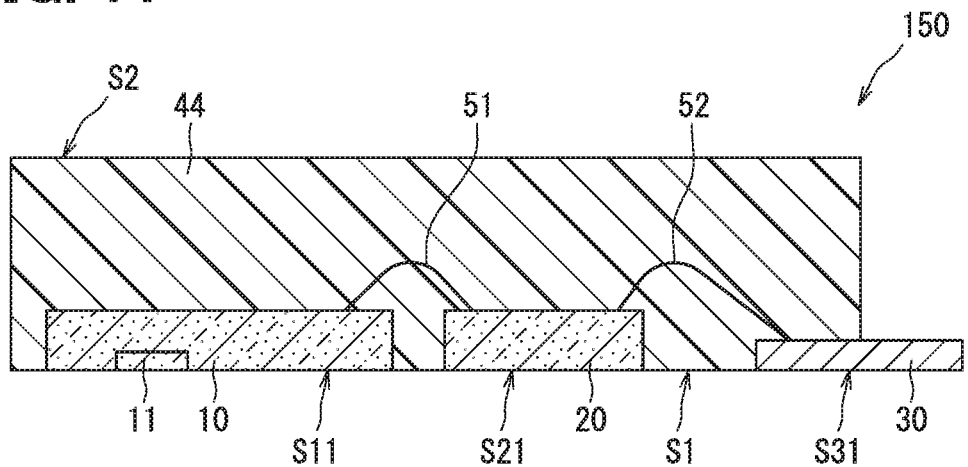
FIG. 11 is a cross-sectional view showing a schematic configuration of a semiconductor device in a sixth embodiment.
Figure 12:
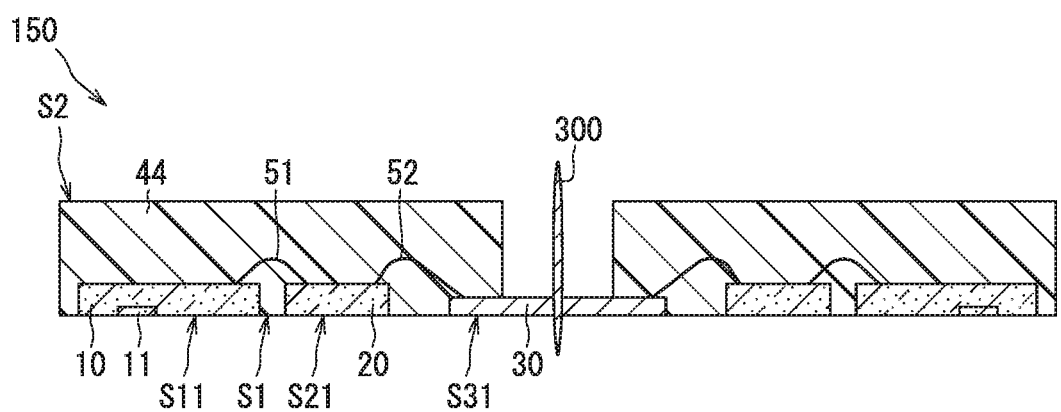
FIG. 12 is a cross-sectional view illustrating a method for producing the semiconductor device in the sixth embodiment.

With reference to FIGS. 11 and 12, a description will be given of a semiconductor device 150 of the sixth embodiment. A description is given herein of the sixth embodiment with emphasis on portions different from those in the first embodiment. In the semiconductor device 150, the same parts as those of the semiconductor device 100 are denoted by the same reference numerals. As for the components denoted by the same reference numerals as used for the semiconductor device 100, the embodiment described above can be referred to and applied to the sixth embodiment.

The semiconductor device 150 is different from the semiconductor device 100 in terms of a shape of a sealing resin portion 44. As shown in FIG. 11, the sealing resin portion 44 has the shape in which the external connection terminal 30 protrudes from a side surface of the sealing resin portion 44. The sealing resin portion 44 has a side surface contiguous to the surface S2 opposite to the one surface S1. The external connection terminal 30 has a portion provided to protrude from the side surface of the sealing resin portion 44.

Note that, in the same manner as in the production method of the first embodiment, the semiconductor device 150 can be produced by forming the sealing resin portion 44 such that portions of the external connection terminal 30 other than the terminal surfaces S31 are covered with the sealing resin portion 44, and then removing the sealing resin portion 44 from over the external connection terminals 30 using a laser or the like. Then, as shown in FIG. 12, in the dicing step, the external connection terminal 30 is cut.

In the semiconductor device 150, the sealing resin portion 44 may also be removed from over the external connection terminals 30 after the dicing step. By thus simultaneously cutting the sealing resin portion 44 and the external connection terminal 30 in the dicing step, it is possible to suppress breakage between the sealing resin portion 44 and the external connection terminals 30 and deformation of the external connection terminals 30.

The semiconductor device 150 can achieve the similar effects as achieved by the semiconductor device 100. In addition, in the semiconductor device 150, the external connection terminal 30 protrudes from the side surface of the sealing resin portion 44 to be easily connected to each of external elements in various connection modes. Note that the present production method can achieve the similar effects as achieved by the first embodiment.

Note that the sixth embodiment can also be implemented by being combined with each of the third to fifth embodiments. This allows the semiconductor device 150 to achieve the similar effects as achieved by the corresponding one of the semiconductor devices 110 to 140.

Seventh Embodiment

Figure 13:
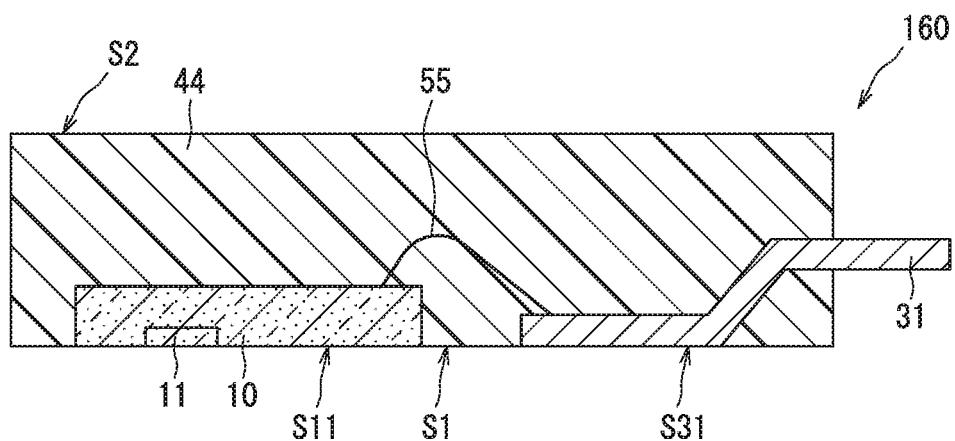
FIG. 13 is a cross-sectional view showing a schematic configuration of a semiconductor device in a seventh embodiment.

With reference to FIG. 13, a description will be given of a semiconductor device 160 of the seventh embodiment. A description is given herein of the seventh embodiment with emphasis on portions different from those in the first embodiment. In the semiconductor device 160, the same parts as those of the semiconductor device 100 are denoted by the same reference numerals. As for the components denoted by the same reference numerals as used for the semiconductor device 100, the embodiment described above can be referred to and applied to the seventh embodiment.

The semiconductor device 160 does not include the control element 20. In the semiconductor device 160, the sensor element 10 and the external connection terminal 31 are directly connected via a wire 55. In the semiconductor device 160, in the same manner as in the semiconductor device 100, the semiconductor top surface S11 and the terminal surface S31 are exposed at the one surface S1. Also, in the present embodiment, the external connection terminal 31 having a bent shape is used. The external connection terminal 31 has the terminal surface S31 exposed at the one surface S1, while protruding from a side surface of the sealing resin portion 44. The semiconductor device 160 thus configured can achieve the similar effects as achieved by the semiconductor device 100.

Note that the seventh embodiment can also be implemented by being combined with each of the first, second, fourth, and sixth embodiments. Specifically, even when the control element 20 is not included in each of these embodiments, the effects achieved in each of the embodiments described above can be achieved. Also, the external connection terminal 31 can be applied to each of the first to sixth embodiments and the embodiments described below.

Eighth Embodiment

Figure 14:
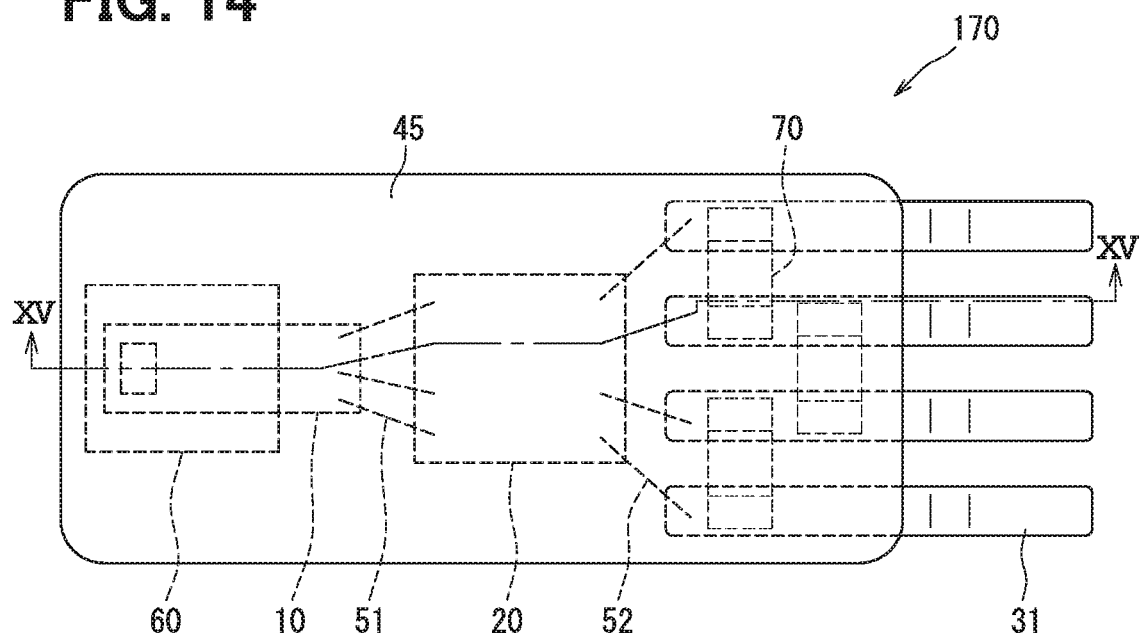
FIG. 14 is a plan view showing a schematic configuration of a semiconductor device in an eighth embodiment.
Figure 15:
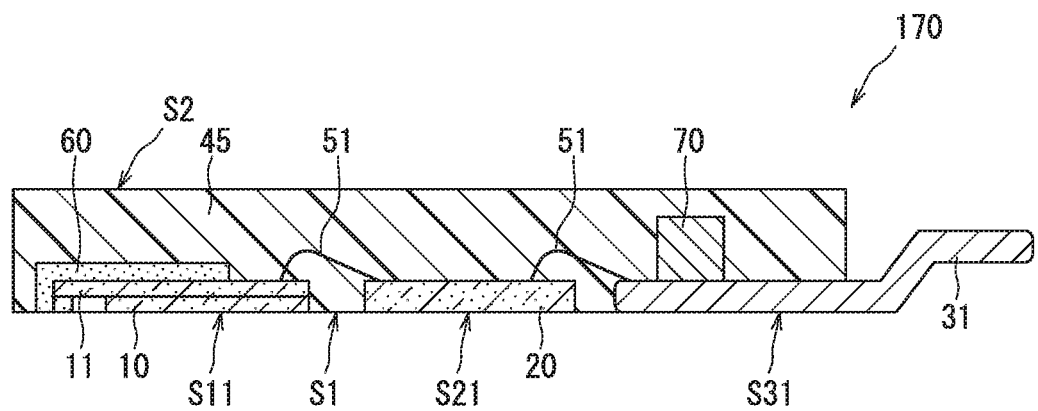
FIG. 15 is a cross-sectional view along a line XV-XV in FIG. 14.

With reference to FIGS. 14 and 15, a description will be given of a semiconductor device 170 of the eighth embodiment. A description is given herein of the eighth embodiment with emphasis on portions different from those in the first embodiment. In the semiconductor device 170, the same parts as those of the semiconductor device 100 are denoted by the same reference numerals. As for the components denoted by the same reference numerals as used for the semiconductor device 100, the embodiment described above can be referred to and applied to the eighth embodiment.

In the semiconductor device 170, between the sensor element 10 and a sealing resin portion 45, a member 60 made of a silicone gel, rubber, or the like having an elastic modulus lower than that of the sealing resin portion 45 is provided. In other words, the sealing resin portion 45 is provided so as to cover the stress relaxation member 60. In addition, in the semiconductor device 170, as shown in FIG. 14, capacitors 70 are provided to extend over the different external connection terminals 31. The capacitors 70 have respective terminals electrically connected to the different external connection terminals 31 such as via a conductive paste or the like. As the conductive paste, a silver paste or the like can be used. However, in the semiconductor device 170, the capacitors 70 need not necessarily be provided.

Note that, in the present embodiment, the sensor element 10 including the sensing portion 11 having a diaphragm structure is used. In particular, in the example used in the present embodiment, the gel member 60 is provided over the sensing portion 11.

A description is given herein of a method for producing the semiconductor device 170. The semiconductor device 170 can achieve the similar effects as achieved by the semiconductor device 100. Also, in the present production method, in the same manner as in the first embodiment, the steps previous to and including the mounting step are performed. Then, in the present production method, over the external connection terminals 31, the capacitors 70 are placed via the conductive paste. Then, the conductive paste is cured to integrate the capacitors 70 over the external connection terminals 31. In other words, the external connection terminals 31 and the capacitors 70 are electrically and mechanically connected. Note that the step of mounting the capacitors 70 can also be regarded as a portion of the mounting step described above.

In the present production method, thereafter, the stress relaxation member 60 is applied to the sensor element 10 and then cured. Then, in the present production method, the stress relaxation member 60 is cured, and then the steps including and subsequent to the sealing step are performed. This allows the semiconductor device 170 to be produced.

The semiconductor device 170 can achieve the similar effects as achieved by the semiconductor device 100. In addition, in the semiconductor device 170, it is possible to suppress a stress resulting from the linear expansion coefficient difference between the sensor element 10 and the sealing resin portion 45 from being applied to the sensor element 10, particularly to the sensing portion 11, and protect the sensor element 10. Accordingly, in the semiconductor device 170, influence of fluctuations in sensor property can be reduced compared to that when the stress relaxation member 60 is not provided. Note that the present production method can achieve the similar effects to those achieved in the first embodiment.

Note that the eighth embodiment can also be implemented by being combined with each of the second to seventh embodiments. This allows the semiconductor device 170 to achieve the similar effects as achieved by the corresponding one of the semiconductor devices 110 to 160. The capacitors 70 can also be used in each of the other embodiments.

Ninth Embodiment

Figure 16:
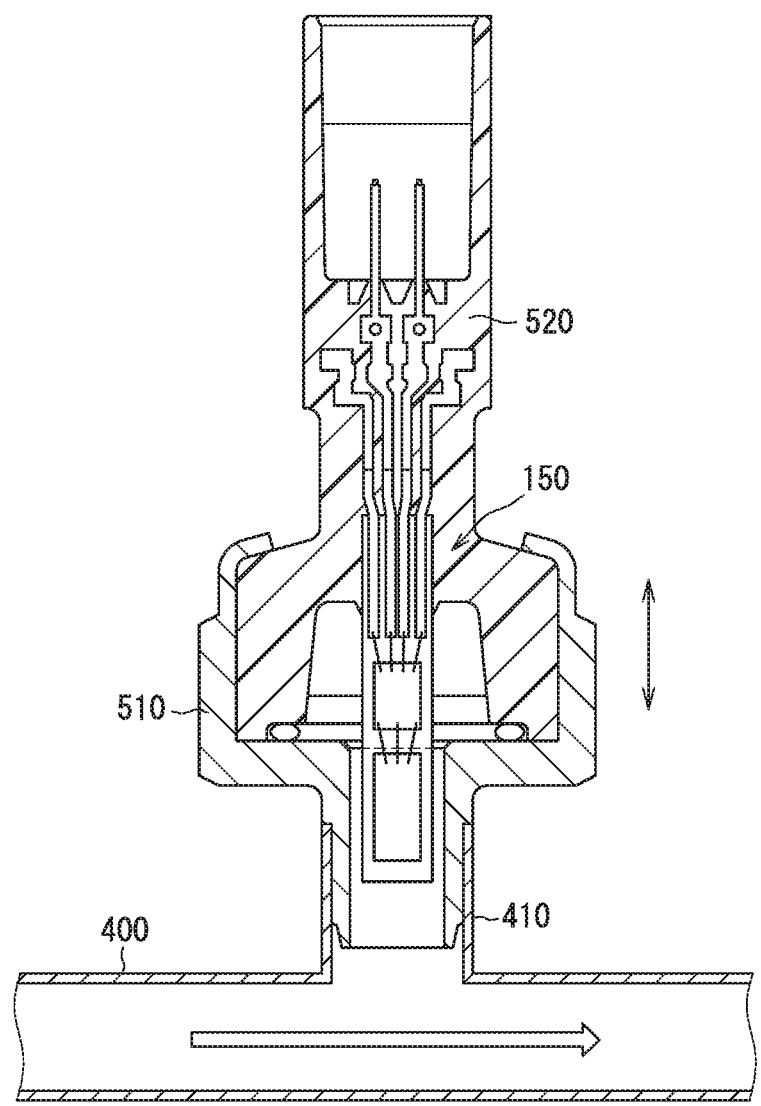
FIG. 16 is a cross-sectional view showing an example of mounting of a semiconductor device in a ninth embodiment.

With reference to FIG. 16, a description will be given of the ninth embodiment. A configuration obtained by assembling the semiconductor device 150 to a case plug is used herein. The case plug includes a sensor housing 510 and a connector case 520. The case plug is a member for providing connection to a pipe 400 in which a fluid as an object to be detected by the sensor element 10 flows and connection between the external connection terminal 30 and an external element. As the sensor element 10, a sensor which detects a temperature of the fluid is used by way of example.

The sensor housing 510 is a portion to be connected, i.e., attached to an attachment hole 410 of the pipe 400. The sensor housing 510 has one opening end portion fixed to the fixation hole 410 and the other opening end portion to which the connector case 520 is fixed. The connector case 520 includes a connector terminal to which the semiconductor device 150 is fixed and which is electrically connected to the external connection terminal 30, and a holding portion holding the connector terminal. The sensor housing 510 and the connector case 520 are assembled via a closely adhesive member such as an O-ring. The semiconductor device 150 is fixed to the connector case 520 by press fitting or the like.

In the semiconductor device 150, as the sensor element 10 is closer to the fluid as the object to be detected, the sensor element 10 has higher temperature responsiveness. In addition, in the semiconductor device 150, since the sensor element 10 is not mounted on a lead frame, a position of the sensor element 10 does not depend on the lead frame. Accordingly, in the semiconductor device 150, the position of the sensor element 10 can arbitrarily be determined. Therefore, in the semiconductor device 150, the position of the sensor element 10 relative to the fluid as the object to be detected can easily be adjusted. The position mentioned herein is a position in a direction indicated by a double-headed arrow in FIG. 16.

Note that, in the present embodiment, by way of example, the semiconductor device 150 is used. However, the present disclosure is not limited thereto. Each of the other semiconductor devices 100 to 140, 160, and 170 can be used in the present embodiment.

Tenth Embodiment

Figure 17:
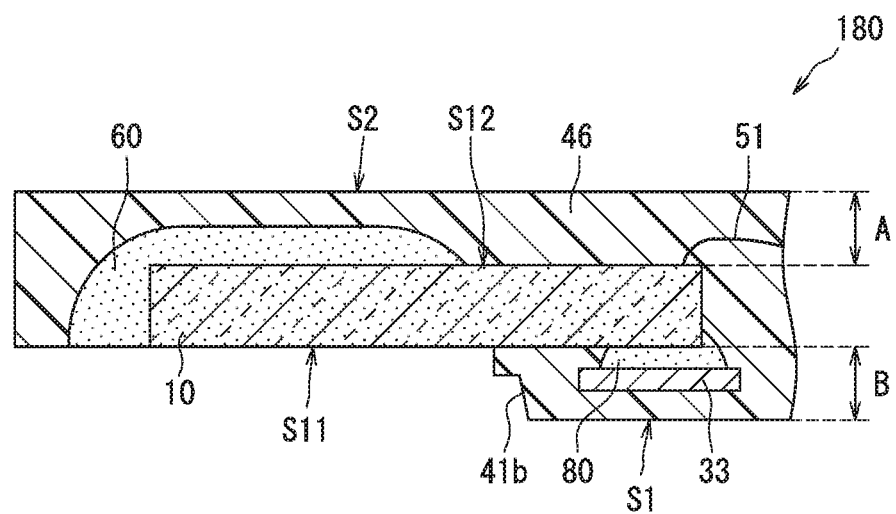
FIG. 17 is an enlarged cross-sectional view showing a schematic configuration of a semiconductor device in a tenth embodiment.
Figure 18:
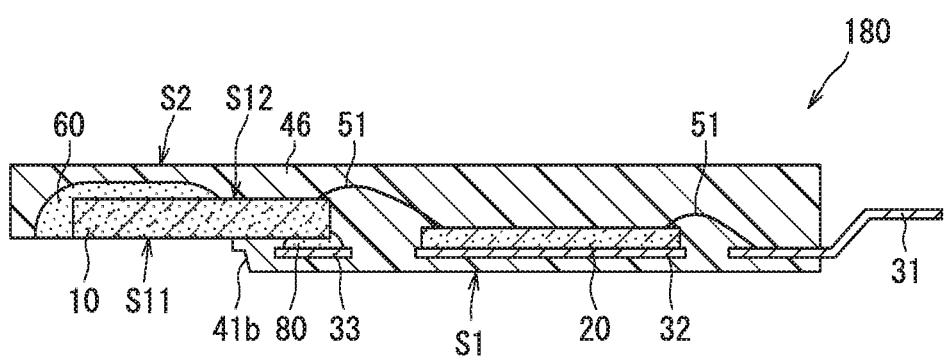
FIG. 18 is a cross-sectional view showing the schematic configuration of the semiconductor device in the tenth embodiment.
Figure 19:
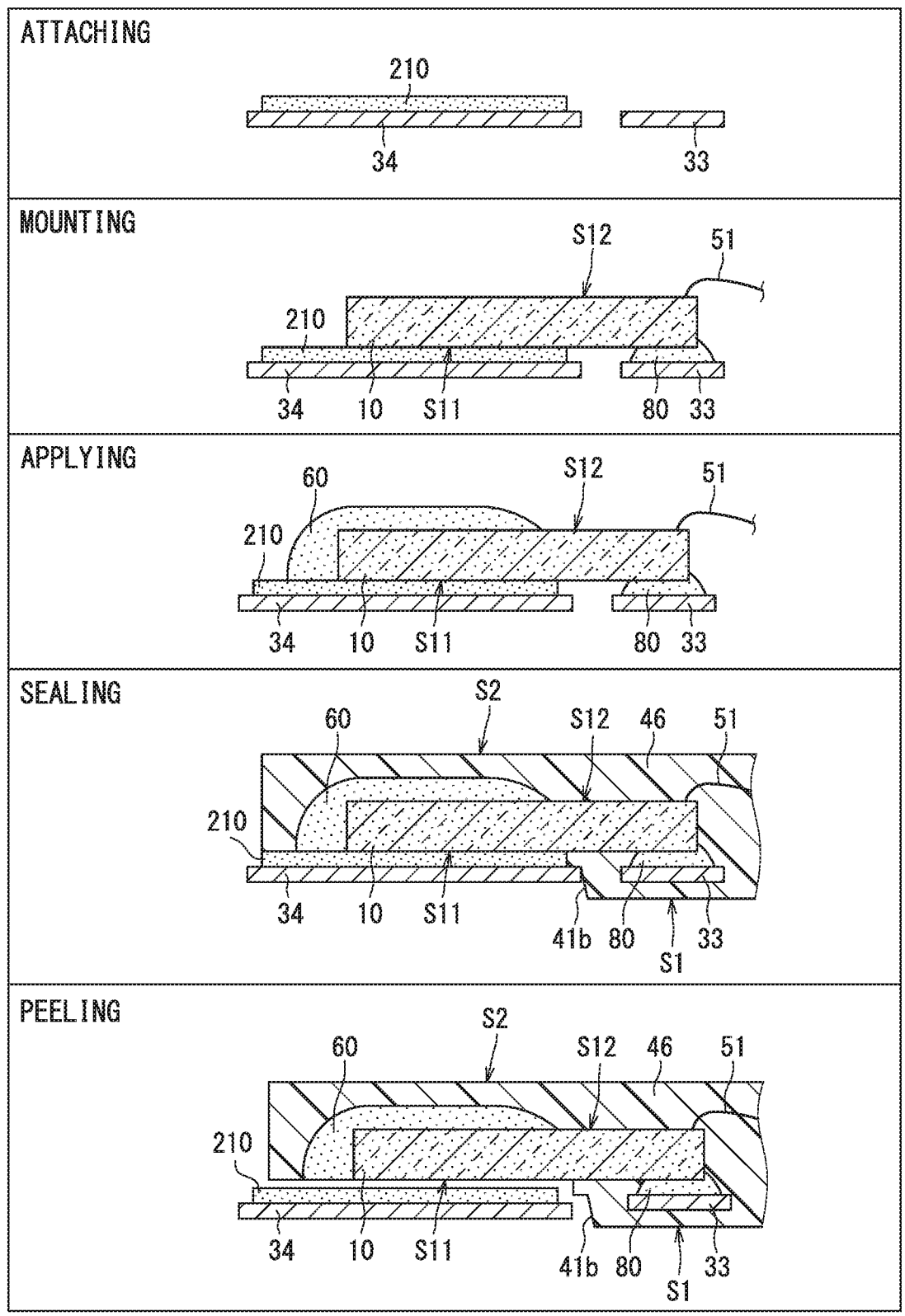
FIG. 19 is a step-by-step cross-sectional view showing a method for producing the semiconductor device in the tenth embodiment.

With reference to FIGS. 17, 18, and 19, a description will be given of a semiconductor device 180 of the tenth embodiment. A description is given herein of the tenth embodiment with emphasis on portions different from those in the eighth embodiment. In the semiconductor device 180, the same parts as those of the semiconductor device 170 are denoted by the same reference numerals. As for the components denoted by the same reference numerals as used for the semiconductor device 170, the eighth embodiment can be referred to and applied to the tenth embodiment. Note that, in FIG. 17, the sensor element 10 is illustrated in a simplified manner. Also, to the present embodiment, the foregoing embodiment can be applied unless otherwise specified.

The semiconductor device 180 is mainly different from the semiconductor device 170 in terms of a configuration of a sealing resin portion 46. In the semiconductor device 180, the capacitors 70 are not provided, but the capacitors 70 may also be provided.

The semiconductor device 180 includes the external connection terminals 31, a mounting portion 32, and a bonding holding member 33 each as a portion of a lead frame. On the mounting portion 32, the control element 20 is mounted and sealed in the sealing resin portion 46. The control element 20 is mechanically connected to the mounting portion 32 via an adhesive material.

The bonding holding member 33 corresponds to a holding member, is connected to a portion of the semiconductor top surface S11 which is not exposed from the sealing resin portion 46, and is sealed in the sealing resin portion 46. The sensor element 10 is mechanically connected to the bonding holding member 33 via an adhesive material 80. The bonding holding member 33 is provided so as to hold the sensor element 10 when the first wires 51 are bonded to the sensor element 10. However, in the present disclosure, the bonding holding member 33 need not necessarily be provided. In other words, in the present disclosure, the lead frame on which the sensor element 10 is to be mounted need not necessarily be provided.

The first wire 51 is electrically connected to the semiconductor back surface S12 at a projection region to which the bonding holding member 33 is projected. In other words, the first wire 51 is electrically connected to the region of the semiconductor back surface S12 overlapping the bonding holding member 33.

The sealing resin portion 46 integrally holds the sensor element 10, the control element 20, and the first wires 51 in a state where a portion of the sensor element 10 is exposed on a side adjacent to the one surface S1. The sealing resin portion 46 also integrally seals the stress relaxation member 60, the mounting portion 32, the bonding holding member 33, a portion of the external connection terminal 31, and the adhesive material 80. In other words, the sealing resin portion 46 integrally seals the sensor element 10, the control element 20, the first wires 51, the stress relaxation member 60, the mounting portion 32, the bonding holding member 33, the portion of the external connection terminal 31, and the adhesive material 80 in a state where the portion of the sensor element 10 is exposed on the side adjacent to the one surface S11.

In particular, the sealing resin portion 46 is provided such that a stress applied from a portion thereof provided on the semiconductor top surface S11 side to the sensor element 10 is equal to a stress applied from a portion thereof provided on the semiconductor back surface S12 side to the sensor element 10. In other words, in the semiconductor device 180, the sealing resin portion 46 is provided so as to achieve a balance between the stress applied from the semiconductor top surface S11 side to the sensor element 10 and the stress applied from the semiconductor back surface S12 side to the sensor element 10.

Accordingly, the sealing resin portion 46 is for example provided such that a distance B between the semiconductor top surface S11 and the one surface S1 is equal to a distance A between the semiconductor back surface S12 and the opposite surface S2. It can be said that the distance B corresponds to a length from the semiconductor top surface S11 to the one surface S1. On the other hand, it can be said that the distance A corresponds to a length from the semiconductor back surface S12 to the opposite surface S2. The length mentioned herein is a length along a virtual straight line perpendicular to the semiconductor top surface S11 or the like. Therefore, it can be said that, in the semiconductor device 180, the thickness from the semiconductor top surface S11 to the one surface S1 is equal to the thickness from the semiconductor back surface S12 to the opposite surface S2.

In the semiconductor device 180, in the same manner as in the semiconductor device 170, the gel member 60 is provided. Specifically, the semiconductor device 180 includes, between the sensor element 10 and the sealing resin portion 46, the stress relaxation member 60 having a linear expansion coefficient or an elastic modulus lower than that of the sealing resin portion 46. Accordingly, the semiconductor device 180 can achieve the similar effects as achieved by the semiconductor device 170.

Preferably, the stress relaxation member 60 is provided continuously over the semiconductor back surface S12 and a side surface contiguous to the semiconductor back surface S12. Specifically, the stress relaxation member 60 is preferably provided continuously over the semiconductor back surface S12 and also a side surface of a tip portion of the sensor element 10 and another side surface thereof. In the present embodiment, for example, the stress relaxation member 60 is provided over the projection region where the portion of the sensor element 10 exposed from the sealing resin portion 46 is projected and the side surface contiguous to the region. The projection region mentioned herein is a portion of the semiconductor back surface S12. As a result, the semiconductor device 180 allows the effect achieved by the stress relaxation member 60 to be further improved. Note that this point is also applicable to the eighth embodiment.

With reference to FIG. 19, a description will be given of a method for producing the semiconductor device 180.

First, in the same manner as in the first embodiment, the attaching step is performed. However, in the present embodiment, instead of the supporting body 200, a supporting body 34 as a portion of the lead frame is used. Accordingly, in the present production method, the adhesive film 210 is adhered to the supporting body 34. In the adhering step, the adhesive film 210 is adhered onto the supporting body 34, while the adhesive film 210 is not adhered to the bonding holding member 33.

Then, in the mounting step, the sensor element 10 is placed on the supporting body 34 on which the adhesive film 210 is provided such that a portion of the semiconductor top surface S11 comes into contact with the adhesive film 210. Also, in the mounting step, the sensor element 10 and the bonding holding member 33 are mechanically connected via the adhesive material 80. In addition, in the mounting step, the sensor element 10 and an electronic component (which is the control element 20 herein) are electrically connected via the first wire 51.

Note that the control element 20 is mounted on the mounting portion 32 before being connected via the first wire 51. Likewise, the sensor element 10 is mechanically connected to the bonding holding member 33 before being connected via the first wire 51. Thus, in the present production method, the sensor element 10 is mechanically connected to the bonding holding member 33. Accordingly, it is possible to restrict the sensor element 10 from being displaced when the first wire 51 is connected thereto. Specifically, in the present production method, it is possible to restrict the sensor element 10 from lifting up from the adhesive film 210 due to a pressing force applied to the sensor element 10 when the first wire 51 is connected thereto. Therefore, in the present production method, during the sealing step described later, it is possible to restrict a resin from entering a gap between the adhesive film 210 and the sensor element 10.

Subsequently, in the same manner as in the eighth embodiment, the applying step, the sealing step, and the peeling step are performed. However, in the present sealing step, the sealing resin portion 46 is provided so as to provide the semiconductor device 180 described above. In other words, in the sealing step, the sealing resin portion 46 is provided such that the stress applied from the portion of the sealing resin portion 46 provided on the semiconductor top surface S11 side to the sensor element 10 is equal to the stress applied from the portion of the sealing resin portion 46 provided on the semiconductor back surface S12 side to the sensor element 10. This allows the semiconductor device 180 described above to be produced.

In particular, in the present sealing step, the sealing resin portion 46 is provided such that the distance B between the semiconductor top surface S11 and the one surface S1 is equal to the distance A between the semiconductor back surface S12 and the opposite surface S2. For example, the distance between the semiconductor top surface S11 and the one surface S1 and the distance between the semiconductor back surface S12 and the opposite surface S2 can be set by providing a stepped portion or the like in a mold die for performing the sealing step. This allows the semiconductor device 180 in which the distance B between the semiconductor top surface S11 and the one surface S1 is equal to the distance A between the semiconductor back surface S12 and the opposite surface S2 to be produced.

Thus, in the semiconductor device 180, the sealing resin portion 46 integrally holds the sensor element 10, the control element 20, and the first wire 51. This can reduce the number of components and a physical size of the semiconductor device 180. For example, in the semiconductor device 180, there is no need for a lead frame on which the sensor element 10 is to be mounted. In addition, in the semiconductor device 180, the sealing resin portion 46 is provided such that the stress applied from the semiconductor top surface S11 side to the sensor element 10 is equal to the stress applied from the semiconductor back surface S12 side to the sensor element 10. In other words, the sealing resin portion 46 is provided such that the stress applied from the portion thereof provided on the semiconductor top surface S11 side to the sensor element 10 is equal to the stress applied from the portion thereof provided on the semiconductor back surface S12 side to the sensor element 10. Thus, each of the stresses applied herein is the stress applied from the sealing resin portion 46 to the sensor element 10.

Accordingly, in the semiconductor device 180, it is possible to more reliably restrict deformation of the sensor element 10 than when the stress from the semiconductor top surface S11 side is different from the stress from the semiconductor back surface S12 side. For example, it is possible to restrict the semiconductor device 180 from being warped in a direction in which a lower stress is applied to the sensor element 10. Therefore, in the semiconductor device 180, the stress to the sensor element 10 can be reduced compared to that when the stress from the semiconductor top surface S11 side is different from the stress from the semiconductor back surface S12 side.

In addition, the semiconductor device 180 is preferably provided such that the distance B between the semiconductor top surface S11 and the one surface S1 is equal to the distance A between the semiconductor back surface S12 and the opposite surface S2. By doing so, in the semiconductor device 180, it is easier to equalize the stress applied from the portion provided on the semiconductor top surface S11 side to the sensor element 10 and the stress applied from the portion provided on the semiconductor back surface S12 side to the sensor element 10.

Note that, in the present embodiment, by way of example, the semiconductor device 180 in which only a portion of the semiconductor top surface S11 is exposed from the sealing resin portion 46 is used. However, the semiconductor device 180 is not limited thereto. In the same manner as in the eighth embodiment, not only the portion of the semiconductor top surface S11, but also a component surface of the control element 20 or the external connection terminal 31 as an electronic component may also be exposed from the sealing resin portion 46 on a side adjacent to the one surface S1. In other words, in the semiconductor device 180, it may also be possible to allow the sealing resin portion 40 to hold the sensor element 10, the control element 20, the external connection terminal 31, and the first wire 51 without providing the mounting portion 32 or the like. In this case, in the semiconductor device 180, there is no need for a lead frame on which a semiconductor element (sensor chip) is to be mounted, an adhesive material for mechanically bonding the lead frame and the semiconductor element, and the like, which allows a reduction in the number of the components of the semiconductor device 180. In addition, the semiconductor device 180 can have a physical size lower than that when a lead frame is used.

Also, in the present embodiment, to reduce stresses generated between the sealing resin portion 46, the gel member 60, and the sensor element 10, gel members 61 to 63 may also be inventively improved as described below in first to third modifications. Note that, in FIGS. 20 to 23, to allow respective shapes of the gel members 61 to 63 to be easily recognized, a state before the sealing resin portion is provided is shown.

(First Modification)

Figure 20:
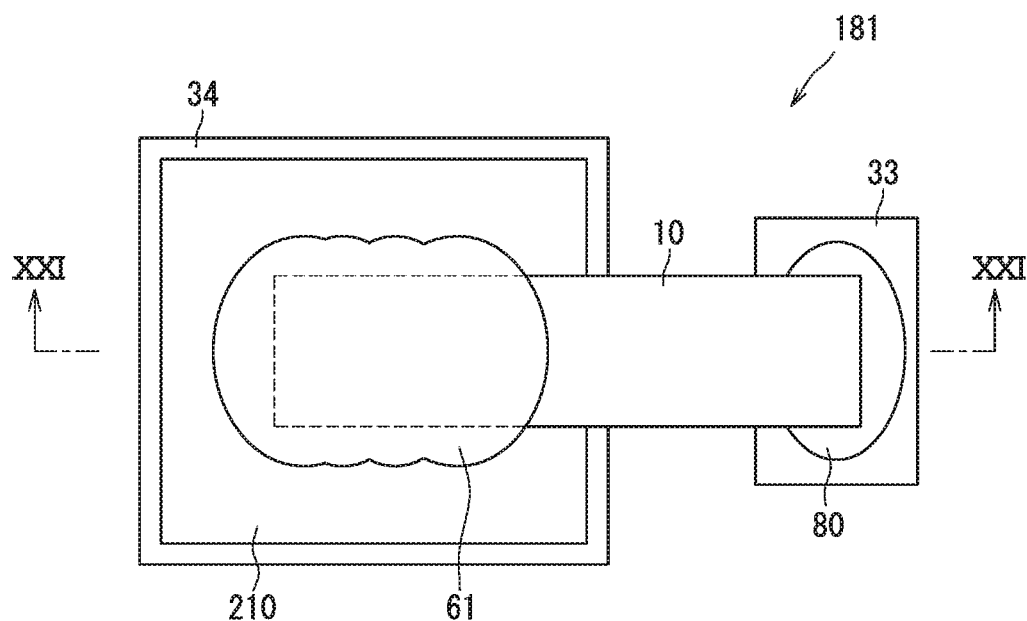
FIG. 20 is a plan view showing a schematic configuration of a semiconductor device during production, in a first modification.
Figure 21:
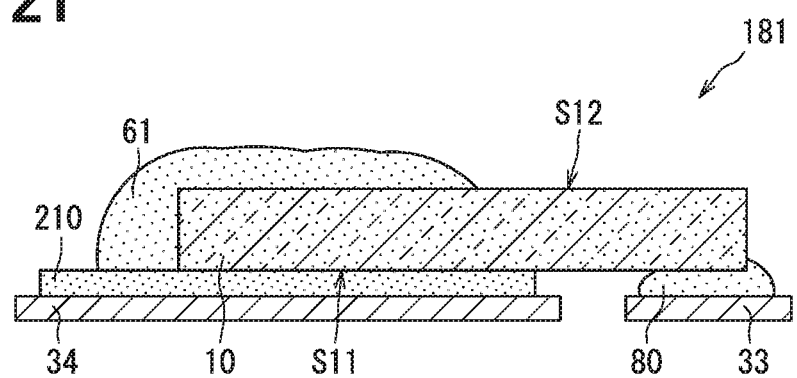
FIG. 21 is a cross-sectional view along a line XXI-XXI in FIG. 20.

As shown in FIGS. 20 and 21, in a semiconductor device 181, the stress relaxation member 61 is provided. The stress relaxation member 61 is provided in a large amount around an outline of the sensor element 10. In other words, the stress relaxation member 61 is supplied in a larger amount around the outline of the sensor element 10 than the gel member 60. Accordingly, the stress relaxation member 61 is provided to have a shape in which, when viewed in plan view from the semiconductor back surface S12 side, a portion of the stress relaxation member 61 corresponding to the outline of the sensor element 10 protrudes from a periphery thereof, i.e., a rugged shape.

(Second Modification)

Figure 22:
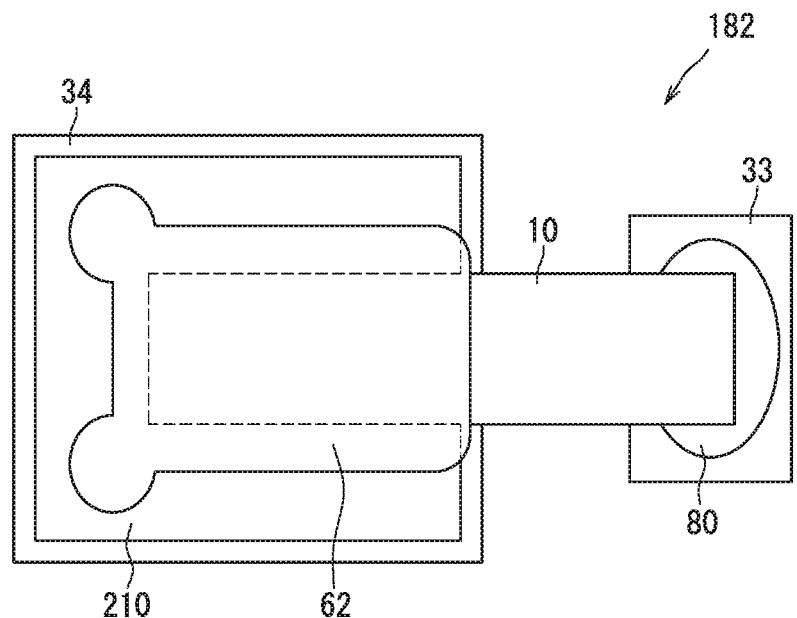
FIG. 22 is a plan view showing a schematic configuration of a semiconductor device during production, in a second modification.

As shown in FIG. 22, in a semiconductor device 182, the stress relaxation member 62 is provided. The stress relaxation member 62 is provided in a large amount around corner portions of the sensor element 10. In other words, the stress relaxation member 62 is supplied in a larger amount around the corner portions of the sensor element 10 than the stress relaxation member 60. Accordingly, the stress relaxation member 62 is provided to have a shape in which, when viewed in plan view from the semiconductor back surface S12 side, portions of the stress relaxation member 62 corresponding to the corner portions of the sensor element 10 protrude from a periphery thereof.

(Third Modification)

Figure 23:
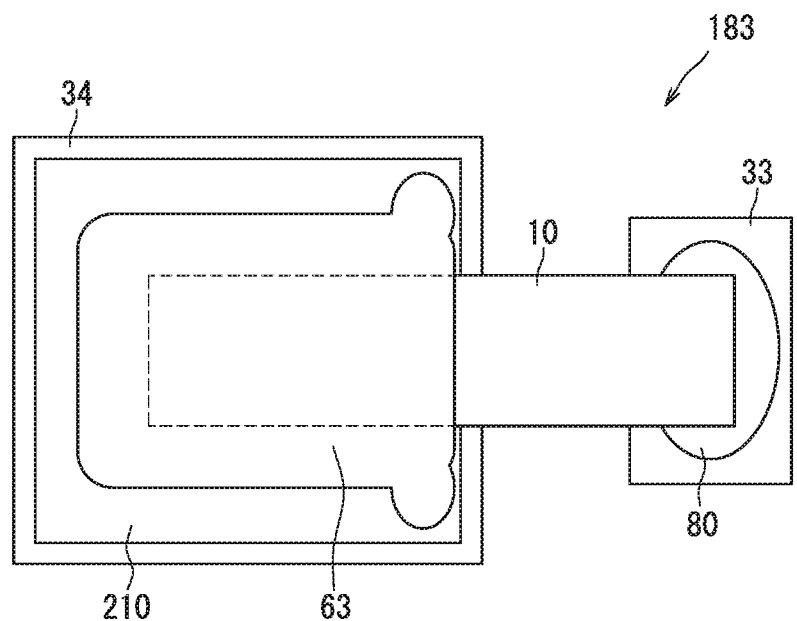
FIG. 23 is a plan view showing a schematic configuration of a semiconductor device during production in a third modification.

As shown in FIG. 23, in a semiconductor device 183, the stress relaxation member 63 is provided. The stress relaxation member 63 is provided in a large amount around a boundary between the sensor element 10 and the adhesive film 210. In other words, the stress relaxation member 63 is provided in a larger amount around a boundary of a projection region where a portion of the sensor element 10 exposed from the sealing resin portion is projected. The stress relaxation member 63 is supplied in a larger amount around the boundary between the sensor element 10 and the adhesive film 210 than the stress relaxation member 60. Accordingly, the stress relaxation member 63 is provided to have a shape in which, when viewed in plan view from the semiconductor back surface S12 side, a portion of the stress relaxation member 63 corresponding to a periphery of the boundary between the sensor element 10 and the adhesive film 210 protrudes from a periphery thereof.

Note that the portion exposed from the sealing resin portion is a portion of the semiconductor top surface S11. Accordingly, the projection region is a portion of the semiconductor back surface S12.

While the present disclosure has been described in accordance with the above embodiments, it is understood that the present disclosure is not limited to the above embodiments and structures. The present disclosure embraces various changes and modifications within the range of equivalency. In addition, various combinations and modifications and other combinations and modifications including only one element or more or less than one element are within the scope and sprit of the present disclosure.

What is claimed is:

1. A semiconductor device comprising:
   a semiconductor element having a sensing portion that detects a physical quantity;
   a circuit element electrically connected to the semiconductor element;
   an external connection terminal electrically connected to the circuit element;
   a first connection member electrically connecting the circuit element and the semiconductor element;
   a second connection member electrically connecting the circuit element and the external connection terminal; and
   a sealing resin portion having a first surface and a second surface opposite to the first surface and integrally holding the semiconductor element, the circuit element, the external connection terminal, the first connection member, and the second connection member in a state where a semiconductor top surface and a terminal surface are exposed from the sealing resin portion on a side adjacent to the first surface, the semiconductor top surface being a surface of the semiconductor element from which the sensing portion is exposed, and the terminal surface being a surface of the external connection terminal,
   wherein the semiconductor element and the external connection terminal are aligned in an alignment direction parallel with the first surface of the sealing resin portion,
   wherein the circuit element is stacked on the semiconductor element and the external connection terminal on a side opposite to the first surface of the sealing resin portion, and is covered with the sealing resin portion, and
   wherein the circuit element faces at least a part of the semiconductor element via the first connection member and at least a part of the external connection terminal via the second connection member in a stacking direction orthogonal to the alignment direction.

2. The semiconductor device according to claim 1,
   wherein the sealing resin portion is provided with recessed portions each recessed from the first surface to a position reaching corresponding one of the semiconductor top surface and the terminal surface.

3. The semiconductor device according to claim 1, wherein the sealing resin portion is provided on both sides of the circuit element adjacent to the first surface and the second surface to cover the circuit element without exposing the circuit element from the sealing resin portion.

4. The semiconductor device according to claim 1, wherein the sealing resin portion has a side surface contiguous to each of the first surface and the second surface, and
wherein a portion of the external connection terminal protrudes from the side surface.

5. The semiconductor device according to claim 1, further comprising
a stress relaxation member provided between the semiconductor element and the sealing resin portion, the stress relaxation member having a linear expansion coefficient or an elastic modulus lower than that of the sealing resin portion.

6. A semiconductor device comprising:
a semiconductor element including a sensing portion that detects a physical quantity;
a circuit element electrically connected to the semiconductor element;
an external connection terminal electrically connected to the circuit element;
a first connection member electrically connecting the circuit element and the semiconductor element;
a second connection member electrically connecting the circuit element and the external connection terminal; and
a sealing resin portion having a first surface and a second surface opposite to the first surface and integrally holding the semiconductor element, the circuit element, the external connection terminal, the first connection member, and the second connection member in a state where a semiconductor top surface, an element surface, and a terminal surface are exposed from the sealing resin portion on a side adjacent to the first surface, the semiconductor top surface being a surface of the semiconductor element from which the sensing portion is exposed, the element surface being a surface of the circuit element, and the terminal surface being a surface of the external connection terminal,
wherein the semiconductor element, the circuit element and the external connection terminal are aligned in an alignment direction parallel with the first surface of the sealing resin portion, and the semiconductor top surface, the element surface and the terminal surface are recessed from the first surface in a direction orthogonal to the alignment direction,
wherein the sealing resin portion is formed with a first recess recessing from the first surface to the semiconductor top surface, a second recess recessing from the first surface to the element surface, and a third recess recessing from the first surface to the terminal surface,
wherein the first recess defines a bottomed hole having the semiconductor top surface as a bottom,
wherein the second recess defines a bottomed hole having the element surface as a bottom, and
wherein the third recess defines a bottomed hole having the terminal surface as a bottom.

7. The semiconductor device according to claim 6, wherein the sealing resin portion has a side surface contiguous to each of the first surface and the second surface, and
wherein a portion of the semiconductor element including the sensing portion protrudes from the side surface.

8. The semiconductor device according to claim 6, wherein the sealing resin portion has a side surface contiguous to each of the first surface and the second surface, and
wherein a portion of the external connection terminal protrudes from the side surface.

9. The semiconductor device according to claim 6, further comprising:
a stress relaxation member provided between the semiconductor element and the sealing resin portion, the stress relaxation member having a linear expansion coefficient or an elastic modulus lower than that of the sealing resin portion.

* * * * *